(12) United States Patent
Namala et al.

(10) Patent No.: US 12,007,860 B2
(45) Date of Patent: *Jun. 11, 2024

(54) SALVAGING BAD BLOCKS IN A MEMORY DEVICE

(71) Applicant: Micron Technology, Inc., Boise, ID (US)

(72) Inventors: Sri Rama Namala, San Jose, CA (US); Lu Tong, Singapore (SG); Kristopher Kopel, Boise, ID (US); Sheng-Huang Lee, Meridian, ID (US); Chang H. Siau, Saratoga, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,958

(22) Filed: Dec. 6, 2022

(65) Prior Publication Data
US 2023/0111510 A1    Apr. 13, 2023

Related U.S. Application Data

(63) Continuation of application No. 17/396,083, filed on Aug. 6, 2021, now Pat. No. 11,537,484.
(Continued)

(51) Int. Cl.
*G06F 11/20*    (2006.01)
*G11C 16/04*    (2006.01)
*G11C 16/26*    (2006.01)

(52) U.S. Cl.
CPC ...... *G06F 11/2094* (2013.01); *G11C 16/0483* (2013.01); *G06F 2201/85* (2013.01); *G11C 16/26* (2013.01)

(58) Field of Classification Search
CPC .. G06F 11/20; G06F 11/2094; G06F 2201/85; G11C 16/0483
(Continued)

(56) References Cited

U.S. PATENT DOCUMENTS 6,763,445 B1    7/2004   Klein et al.
11,475,974 B2   10/2022  Namala et al.
(Continued)

FOREIGN PATENT DOCUMENTS

CN    110491435         11/2019
CN    114115716 A       3/2022
(Continued)

OTHER PUBLICATIONS

U.S. Appl. No. 17/396,083, filed Aug. 6, 2021, Salvaging Bad Blocks in a Memory Device.
(Continued)

*Primary Examiner* — Chae M Ko
(74) *Attorney, Agent, or Firm* — Schwegman Lundberg & Woessner, P.A.

(57) ABSTRACT

Disclosed in some examples are methods, systems, devices, memory devices, and machine-readable mediums for using a non-defective portion of a block of memory on which there is a defect on a different portion. Rather than disable the entire block, the system may disable only a portion of the block (e.g., a first deck of the block) and salvage a different portion of the block (e.g., a second deck of the block).

20 Claims, 15 Drawing Sheets

Related U.S. Application Data

(60) Provisional application No. 63/071,014, filed on Aug. 27, 2020.

(58) Field of Classification Search
USPC .................................. 714/6.11, 6.13
See application file for complete search history.

(56) References Cited

U.S. PATENT DOCUMENTS

| | | | |
|---|---|---|---|
| 11,776,655 | B2 | 10/2023 | Namala et al. |
| 2007/0230245 | A1 | 10/2007 | Watanabe et al. |
| 2008/0181039 | A1 | 7/2008 | Brede et al. |
| 2009/0157964 | A1 | 6/2009 | Kasorla et al. |
| 2014/0192583 | A1 | 7/2014 | Rajan et al. |
| 2014/0269079 | A1 | 9/2014 | Kamigaichi |
| 2014/0321202 | A1 | 10/2014 | Yang et al. |
| 2015/0213886 | A1 | 7/2015 | Toda |
| 2016/0055918 | A1 | 2/2016 | Kochar et al. |
| 2016/0202910 | A1 | 7/2016 | Ravimohan et al. |
| 2016/0232088 | A1 | 8/2016 | Mohan et al. |
| 2017/0090762 | A1* | 3/2017 | Ea ..................... G11C 29/88 |
| 2017/0213597 | A1 | 7/2017 | Micheloni |
| 2017/0371755 | A1* | 12/2017 | Yang ................... G11C 29/025 |
| 2018/0203774 | A1* | 7/2018 | Srinivasan ......... G11C 16/3459 |
| 2018/0342304 | A1 | 11/2018 | Dunga et al. |
| 2019/0043591 | A1 | 2/2019 | Fastow et al. |
| 2019/0043604 | A1* | 2/2019 | Baca ................... G11C 29/883 |
| 2019/0198514 | A1 | 6/2019 | Kim et al. |
| 2020/0312413 | A1* | 10/2020 | Wang ................. G11C 16/0483 |
| 2022/0019350 | A1 | 1/2022 | Karr |
| 2022/0066894 | A1 | 3/2022 | Namala et al. |
| 2022/0094471 | A1 | 3/2022 | Xu et al. |
| 2022/0199189 | A1* | 6/2022 | Namala ................. G11C 29/83 |
| 2023/0033870 | A1 | 2/2023 | Namala et al. |

FOREIGN PATENT DOCUMENTS

| | | |
|---|---|---|
| CN | 114121099 A | 3/2022 |
| JP | 2018073312 | 5/2018 |

OTHER PUBLICATIONS

U.S. Appl. No. 17/393,886 U.S. Pat. No. 11,475,974, filed Aug. 4, 2021, Memory Device Virtual Blocks using Half Good Blocks.

U.S. Appl. No. 17/965,481, filed Oct. 13, 2022, Memory Device Virtual Blocks using Half Good Blocks.

"Chinese Application Serial No. 202110995374.1, Office Action dated Aug. 23, 2023", with English translation, 14 pages.

* cited by examiner

SALVAGING BAD BLOCKS IN A MEMORY DEVICE

PRIORITY APPLICATION

This application is a continuation of U.S. application Ser. No. 17/396,083, filed Aug. 6, 2021, which claims the benefit of priority to U.S. Provisional Application Ser. No. 63/071,014, filed Aug. 27, 2020, all of which are incorporated herein by reference in their entirety.

FIELD OF INVENTION

Embodiments pertain to memory devices, such as NAND memory devices. Some embodiments relate to utilizing portions of blocks of memory that have defects by using a good portion of the block not affected by the defect. Some embodiments relate to combining the good portion of a defective block with other good portions of other defective blocks to form various virtual block structures.

BACKGROUND

Memory devices for computers or other electronic devices may be categorized as volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, phase-change memory, storage class memory, resistive random-access memory (RRAM), and magnetoresistive random-access memory (MRAM), among others.

Flash memory is utilized as non-volatile memory for a wide range of electronic applications. Flash memory devices typically include one or more groups of transistors such as floating gate or charge trap memory cells that allow for high memory densities, high reliability, and low power consumption.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
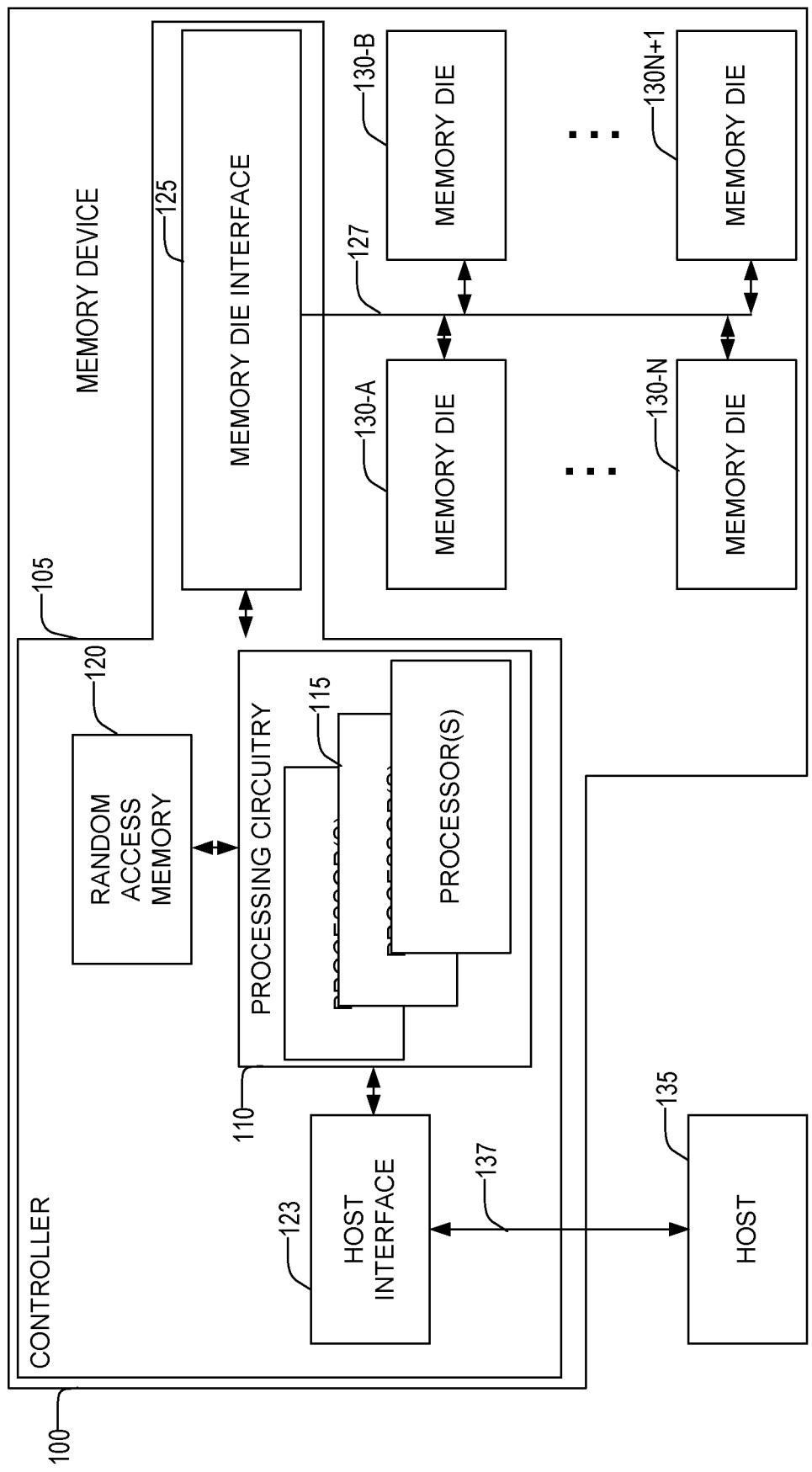
FIG. 1 illustrates a diagram of a memory device, such as a storage device according to some examples of the present disclosure.

Modern flash memory devices may have millions of individual semiconductor memory cells, each of which store one, two, three, or more bits of data. Of those millions of cells, statistically some will be defective as a result of imperfections in manufacturing. For some memory device architectures such as NAND, a defect in a particular memory cell may affect more than just that particular memory cell because each memory cell is connected via word and bit lines to other memory cells in a block of memory cells. These defects may affect the voltages placed on, or read from, other memory cells in the block. Example defects that normally would render an entire block unusable include shorts between two word lines (word line to word line shorts), word lines that are not properly formed and so do not pass electricity (open word lines), slow to program word lines and the like. Given the large amount of memory cells in a typical memory device, statistically, several of these defects are to be expected. Because of these defects, memory devices are typically created with more blocks of memory than necessary to ensure that the capacity of the memory device meets a particular specified size. Additional blocks are added also for redundancy to compensate for failures of memory cells during operation and to allow for various operations such as garbage collection, and the like.

Defects in the memory cells may be determined through testing. For example, after manufacturing and over the life of the memory device, various test procedures may test each memory cell in the memory device to ensure that they perform as expected. Typically, when a defect is discovered in a memory cell, the block in which it is located in is marked as bad, the block is removed from the list of known good blocks, and the block is no longer used to store data. Disabling an entire block for a defect on a few memory cells wastes an enormous amount of memory cells that may still be functioning.

Disclosed in some examples are methods, systems, devices, memory devices, and machine-readable mediums for using a non-defective portion of a block of memory on which there is a defect on a different portion. Rather than disable the entire block, the system may disable only a portion of the block (e.g., a first deck of the block) and salvage a different portion of the block (e.g., a second deck of the block). As used herein, a bad portion is a portion of a block that is not used due to a defect in that portion whereas a salvageable portion is a portion of a block without defects that may be utilized by application of compensation techniques to one or more bad portions on the block. Salvageable portions may be utilized by applying one or more compensation techniques, such as application of one or more bias voltages to one or more bad portions when operations are performed on the salvageable portion.

To address salvageable block portions when reading from or writing to the salvageable block portions, one or more additional address bits may be used to indicate the salvageable portion(s) of the block that are being addressed. For example, portions may comprise one of two decks in a block and the address bit may indicate an upper or lower deck. In some examples, the recovering of a salvageable portion of the block may happen automatically, but in other examples, this may be a feature that may be enabled—either during device setup and/or initialization or during runtime (e.g., in response to a number of defective blocks marked defective during operation exceeding a threshold).

Two or more salvageable block portions may be aggregated together to form virtual blocks. In some examples, these virtual blocks may be organized to take advantage of increased parallelism of the NAND memory device. For example, the NAND may be able to perform multiple operations (e.g., read, write, erase) simultaneously on different planes of the memory device. Thus, the virtual blocks may be created such that a first salvaged block portion from a first plane may be paired in a virtual block with a second salvaged block portion from a second plane, and so on. These virtual blocks may be constructed from any number of different salvaged block portions and may store user data, system data, system table information, and the like.

As noted, bad block portions may be a portion of a block which is unusable due to a defect—either a manufacturing defect or a defect from operation (e.g., cell wear). Salvageable block portions may be a portion of a block in which a bad block portion exists, but the salvaged portion is still usable by applying compensation techniques to one or more portions of the block (including bad block portions and/or salvaged block portions). Example compensation techniques include application of particular bias voltages to the bad block portion during operations on the salvaged block portion.

Memory Device Overview

As previously noted, flash memory is utilized as non-volatile memory for a wide range of electronic applications. Flash memory typically includes one or more groups of transistors such as floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Flash memory cells in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are used to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storage cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), or one of various forms of managed memory device. Memory devices may be configured and operated in accordance with recognized industry standards. For example, NAND devices may be (as non-limiting examples), a Universal Flash Storage (UFS™) device, or an embedded MMC device (eMMC™), etc. For example, in the case of the above examples, UFS devices may be configured in accordance with Joint Electron Device Engineering Council (JEDEC) standards such as JEDEC standard JESD223D, entitled "JEDEC UFS Flash Storage 3.0," and/or updates or subsequent versions to such standard. Similarly, identified eMMC devices may be configured in accordance with JEDEC standard JESD84-$A_{51}$, entitled "JEDEC eMMC standard 5.1", again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

Memory devices include individual memory die, which may, for example, include a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, such as a "host" as discussed later herein. In such managed memory devices, the controller functionality may be implemented on one or more die also incorporating a memory array, or on a separate die. In other examples, one or more memory die may be combined with controller functionality to form a solid-stage drive (SSD) storage volume. The term "memory device," is used herein as inclusive of one or more memory die, and any controller functionality for such memory die, when present; and thus, includes individual memory devices, managed memory devices, and SSDs.

For purposes of the present description, example embodiments include managed memory devices implementing NAND flash memory cells, termed "managed NAND" devices. Such managed NAND devices may be constructed and operated generally in accordance with the described JEDEC UFS Flash Storage 3.0 specification, as may be modified as appropriate to incorporate the structures and functionality described herein. However, the described functionality may be implemented with other types of memory devices, as described above, which may incorporate other storage technologies, a few non-limiting examples of which were discussed earlier herein; and may be configured for operation in accordance with other industry standards, as discussed above; or in accordance with non-industry standard protocols.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates a diagram of a memory device 100, such as a storage device according to some examples of the present disclosure. Memory device 100 may include one or more host interfaces 123 which may utilize one or more protocols such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces to communicate with a host device 135. Host device 135 may send one or more commands, such as read comments, write commands, erase commands, and the like to the memory device 100 through the host interface 123. Host interface 123 may be part of controller 105 or may be implemented by separate circuitry. The memory device 100 may send data, command responses, and the like to host device 135 over the host interface over the host bus 137.

Memory device 100 may include one or more memory controllers 105. Controller 105 may include processing circuitry 110 which may include one or more hardware processors 115. Processors 115 may be general purpose hardware processors that execute firmware or other software instructions for performing operations of the memory device, including implementing the host interface 123 and memory die interface 125. In other examples, the processor(s) 115 may be special purpose hardware processors that are specifically designed to perform the operations of the memory device 100 through hardware logic and/or through the execution of software instructions. Processing circuitry 110 may also include logic circuits and other circuit components configured to perform various control functionality and memory management operations, or portions thereof, examples of which are described below.

In the depicted example, memory device 100 includes a host interface 123 providing communication through a host bus 137 to external host device 135. The configuration of host interface 123 may be of various forms depending upon the specific configuration of memory device 100 (which may also be termed a "memory system"). For example, in an example in which memory device 100 is a UFS device, the host interface will be in accordance with the applicable UFS standard.

Memory device 100 also incorporates one or more memory die interfaces 125 between the processing circuitry 110 of the controller 105 and at least some portion of the memory dies 130-A-130N+1 within memory device 100. Memory die interface 125 may be part of controller 105 or may be implemented by separate circuitry. For example, in the example of a UFS device, one or more of the memory die interfaces 125 will be a suitable memory interface, for example an Open NAND Flash Interface ("ONFI"), such as that defined by the ONFI 4.0 Specification, or later versions or revisions thereof.

Components of the memory device 100, such as controller 105, may include a random-access memory 120 for performing the operations of the memory device 100. The random-access memory 120 may be separate from the controller 105 or, as shown, may be integrated in the controller 105.

Figure 4:
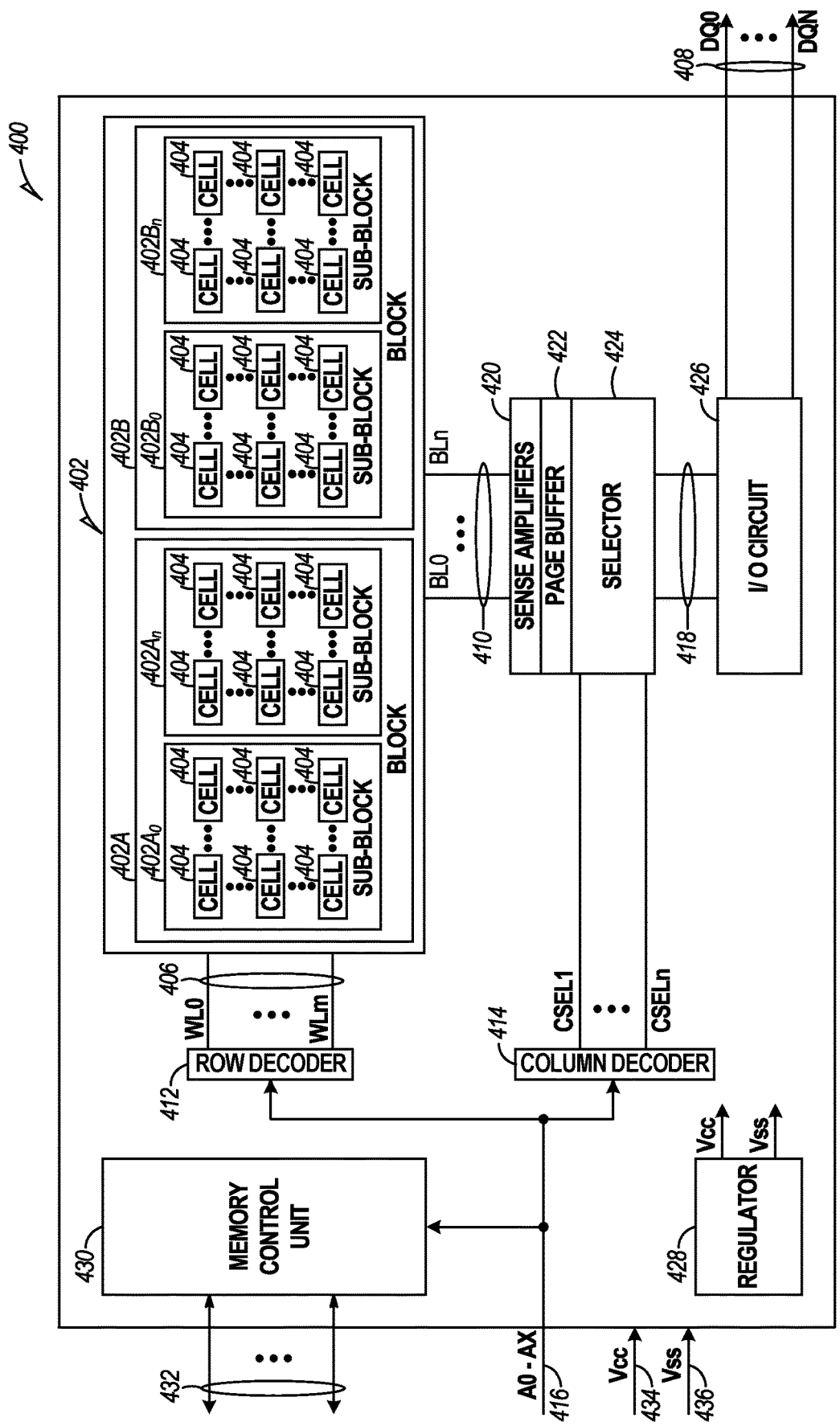
FIG. 4 illustrates an example block diagram of a memory die according to some examples of the present disclosure.

Controller 105 may handle one or more functions of the memory by interacting with the memory cells of the memory device that are part of one or more memory dies 130-A-130N+1. A schematic of an example implementation of a memory die 130 is shown in FIG. 4. The controller 105 may communicate with these memory dies through the memory die interface 125 across a memory die bus 127. In some examples, the memory dies may have their own device controllers, including processing circuitry and processors, to control operations on the respective memory die. Such device controllers may be formed on a common die with the device storage array or may be on a separate die from that containing the device storage array. Both configurations are embraced by the identified "memory die" (130A-N+1) described herein. Memory dies may be NAND dies, three-dimensional NAND dies, phase change memory dies, and the like.

The host device 135 may be a personal computer, a smartphone, a tablet, a portion of an integrated circuit, an Internet of Things (IoT) device (e.g., a refrigerator or other appliance, sensor, motor or actuator, mobile communication device, automobile, drone, etc.), or the like.

For purposes of the present description example memory operation and management functions may be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions.

The memory dies 130-A-130-N+1 can include several memory cells arranged in, for example, a number of planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the memory device 100 in pages and erased in blocks. However, one or more memory operations (e.g., read, write, erase, etc.) can be performed on larger or smaller groups of memory cells, as desired. The data transfer size of a memory device 100 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells can provide for different page sizes or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
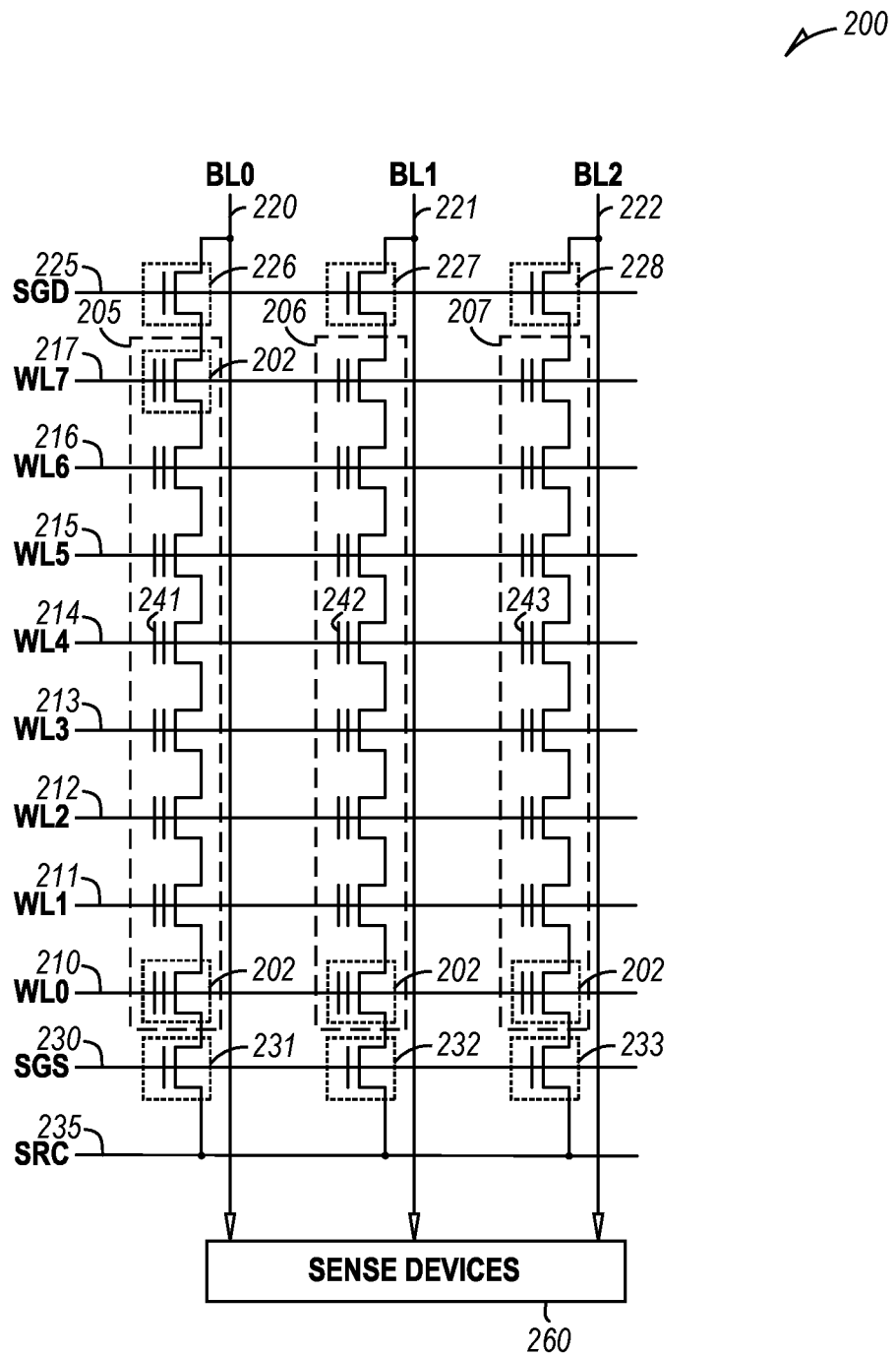
FIG. 2 illustrates an example schematic diagram of a portion of a NAND architecture semiconductor memory array according to some examples of the present disclosure.

FIG. 2 illustrates an example schematic diagram of a portion of a NAND architecture semiconductor memory array 300 including a plurality of memory cells 202 arranged in a two-dimensional array of strings (e.g., strings 205-207) and tiers (e.g., illustrated as respective word lines (WL) WL0-WL7 210-217, a drain-side select gate (SGD) line 225, a source-side select gate (SGS) line 230, etc.), and sense amplifiers or devices 260 according to some examples of the present disclosure. For example, the memory array 200 can illustrate an example schematic diagram of a portion of one physical page of memory cells of a memory die 130 from FIG. 1.

Each string of memory cells is coupled to a source line (SRC) 235 using a respective source-side select gate (SGS) (e.g., SGS 231-233), and to a respective data line (e.g., bit lines (BL) BL0-BL2 220-222) using a respective drain-side select gate (SGD) (e.g., SGDs 226-228). Although illustrated with 8 tiers (e.g., using word lines (WL) WL0-WL7 210-217) and three data lines (BL0-BL2 226-228) in the example of FIG. 2, other examples can include strings of memory cells having more or fewer tiers or data lines, as desired.

In a NAND architecture semiconductor memory array, such as the example memory array 200, the state of a selected memory cell 202 can be accessed by sensing a current or voltage variation associated with a particular data line containing the selected memory cell. The memory array 200 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., control gates (CGs) 241-243 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the charge storage structures of the targeted memory cells. Such charge storage structures may include, for example floating gates or charge trap regions of the respective memory cells. In floating gate memory cells charge is stored in an isolated polysilicon structure; while in charge trap memory cells the charge is typically stored in a dielectric structure.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the charge storage structures of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 260, coupled to one or more of the data lines (e.g., first, second, or third bit lines (BL0-BL2) 220-222), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

For Single Level Cells (SLC), there are two possible voltage levels programmed into the cell, one voltage level represents a binary '1' and another voltage level represents a binary '0' For Multi-Level Cells (MLC), there are four possible voltage levels programmed into the cell. The four possible voltage levels represent '00', '01', '10', and '11'. To program an MLC cell, multiple programming pulses are applied. A first pulse programs a first "page" of data that represents either the most significant bit or least significant bit of the cell. A second pulse programs the second "page" of data that represents the other bit of the cell that was not programmed by the first pulse. Similarly, Triple Level Cells (TLC) store eight possible voltage levels and Quad Level Cells (QLCs) store 16 possible voltage levels.

To read a value stored in one or more memory cells, a read voltage is applied to the wordline of the selected cells. If the voltage stored in the cells of the wordline is greater than the read voltage, the cell passes a voltage to the sense amplifier. For an SLC cell, the read voltage is selected to be between the two voltages representing a '1' and a '0.' For MLC, TLC, and QLC, multiple read operations are used to read each bit stored in the cell—each read operation utilizes a different read voltage.

To erase a memory cell or a group of memory cells (e.g., erasure is typically performed in blocks or sub-blocks), an erasure voltage (Vers) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the charge storage structures of the targeted memory cells to the channels.

Figure 3:
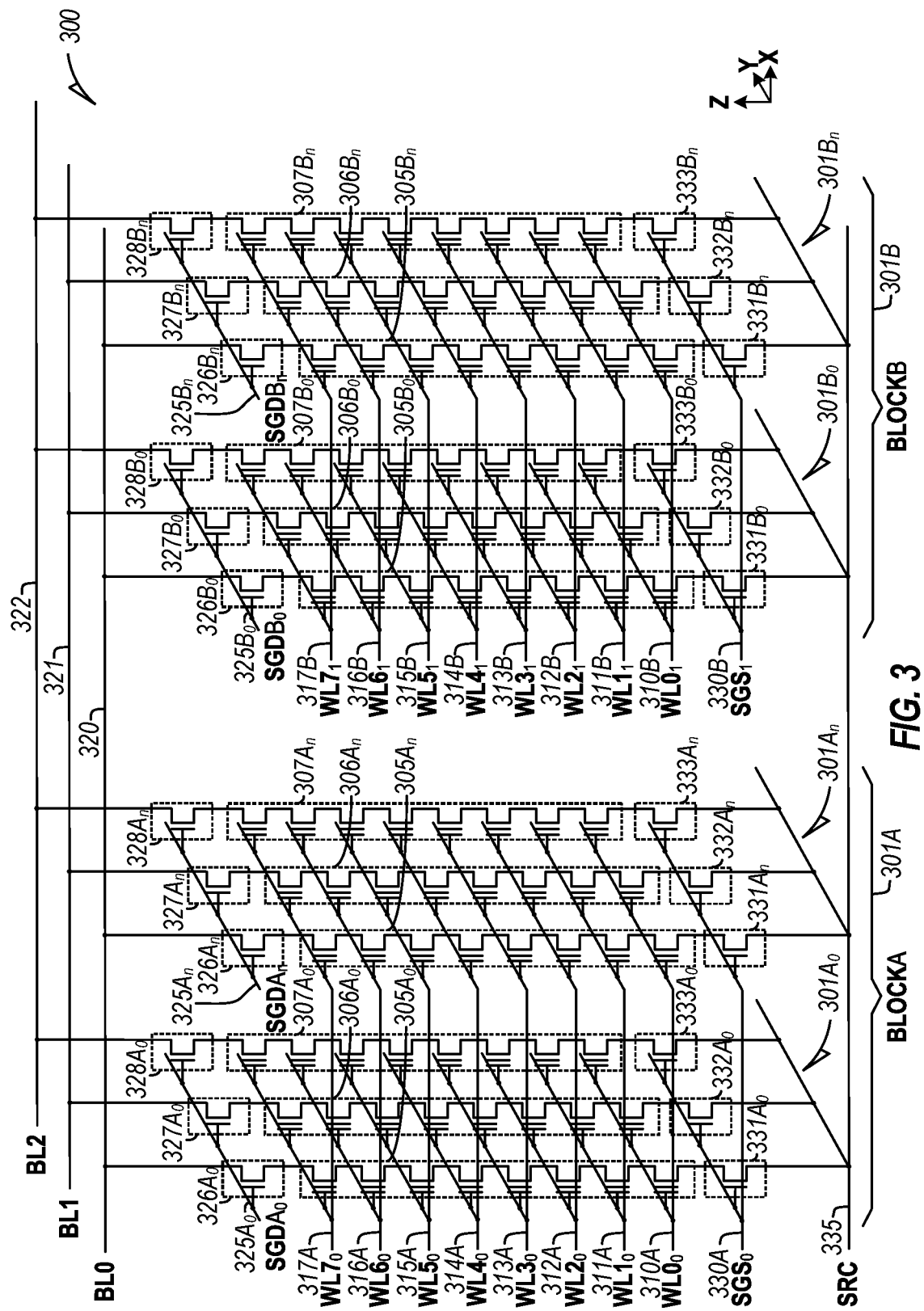
FIG. 3 illustrates an example schematic diagram of a 3D NAND architecture semiconductor memory according to some examples of the present disclosure.

FIG. 3 illustrates an example schematic diagram of a 3D NAND architecture semiconductor memory array 300 including a number of strings of memory cells (e.g., $A_0$ memory strings $305A_0$-$307A_0$, $A_n$ memory strings $305A_n$-$307A_n$, $B_0$ memory strings $305B_0$-$307B_0$, $B_n$ memory strings 305$B_n$-307$B_n$, etc.), organized in blocks (e.g., block A 301A, block B 301B, etc.) and sub-blocks (e.g., sub-block $A_0$ 301$A_0$, sub-block $A_n$ 301$A_n$, sub-block $B_0$ 301$B_0$, sub-block $B_n$ 301$B_n$, etc.). The memory array 300 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 335 or a source-side select gate (SGS) (e.g., $A_0$ SGS 331$A_0$-333$A_0$, $A_n$ SGS 331$A_n$-333$A_n$, $B_0$ SGS 331$B_0$-333$B_0$, $B_n$ SGS 231$B_n$-233$B_n$, etc.) and a drain-side select gate (SGD) (e.g., $A_0$ SGD 326$A_0$-328$A_0$, $A_n$ SGD 326$A_n$-328$A_n$, $B_0$ SGD 326$B_0$-328$B_0$, $B_n$ SGD 326$B_n$-328$B_n$, etc.). Each string of memory cells in the 3D memory array can be arranged along the X direction as data lines (e.g., bit lines (BL) BL0-BL2 320-322), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 300 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 300 includes a control gate (CG) coupled to (e.g., electrically or otherwise operatively connected to) an access line (e.g., word lines (WL) WL$0_0$-WL$7_0$ 310A-317A, WL$0_1$-WL$7_1$ 310B-317B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, $A_0$ SGD 326$A_0$-328$A_0$ can be accessed using an $A_0$ SGD line SGDA$_0$ 325$A_0$, $A_n$ SGD 326$A_n$-328$A_n$ can be accessed using an SGD line SGDA$_n$ 325$A_n$, $B_0$ SGD 326$B_0$-328$B_0$ can be accessed using an $B_0$ SGD line SGDB$_0$ 325$B_0$, and $B_n$ SGD 326$B_n$-328$B_n$ can be accessed using an $B_n$ SGD line SGDB$_n$ 325$B_n$. $A_0$ SGS 331$A_0$-333$A_0$ and $A_n$ SGS 331$A_n$-333$A_n$ can be accessed using a gate select line SGS$_0$ 330A, and $B_0$ SGS 331$B_0$-333$B_0$ and $B_n$ SGS 331$B_n$-333$B_n$ can be accessed using a gate select line SGS$_1$ 330B.

In an example, the memory array 300 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

FIG. 4 illustrates an example block diagram of a memory die 400 including a memory array 402 having a plurality of memory cells 404, and one or more circuits or components to provide communication with, or perform one or more memory operations on, the memory array 402 according to some examples of the present disclosure. The memory die 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402$A_0$, 402$A_n$, and the second block 402B can include first and second sub-blocks 402$B_0$, 402$B_n$. In some examples, a sub-block may be termed a deck. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory die 400 according to one or more signals and/or instructions/commands received on control lines 432 at a memory interface with a memory controller (as described relative to controller 105 and host interface 123 of memory device 100 of FIG. 1. Such signals and/or instructions may include, for example, one or more clock signals and/or control signals that indicate a desired operation (e.g., write, read, erase, etc.), or address signals (A0-AX) received on one or more address lines 416. One or more devices external to the memory die 400 can control the values of the control signals on the control lines 432, or the address signals on the address line 416. Examples of devices external to the memory die 400 can include, but are not limited to, a host, a memory controller, a processor, or one or more circuits or components not illustrated in FIG. 4.

The memory die 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory die 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory die 400, such as a controller 105, can communicate with the memory die 400 using the I/O lines (DQO-DQN) 408, address lines 416 (A0-AX), or control lines 432. The input/output (I/O) circuit 426 can transfer values of data in or out of the memory die 400, such as in or out of the page buffer 422 or the memory array 402, using the I/O lines 408, according to, for example, the control lines 432 and address lines 416. The page buffer 422 can store data received from the one or more devices external to the memory die 400 before the data is programmed into relevant portions of the memory array 402 or can store data read from the memory array 402 before the data is transmitted to the one or more devices external to the memory die 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418. In some examples a flash translation layer (not shown) can map addresses provided by a host to physical memory addresses used by the row decoder 412 and column decoder 414 to read data in the memory array 402.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Salvaging Portions of Bad Blocks

As previously noted, a number of blocks are allocated in each memory die for redundancy, yield, and overprovisioning. Some defects may allow for a block to be partially used given certain compensation techniques. Example defects that are salvageable include a word line-to-word line short that impacts only data word lines; a resistive word line; a slow to program word line; and a word line that does not pass a raw bit error rate (RBER) requirement. In some examples, a salvageable portion of a block that has one or more of the above defects may be isolated from a bad portion of the block by using one or more compensation techniques. The salvageable portion may then be utilized alone, or in combination with other portions of memory to store data. Thus, where one portion of the block is defective and other portion of the block is not defective, the non-defective portion may be enabled for data storage. Example compensation techniques include application of one or more bias voltages to the word lines of the bad portion.

Figure 5:
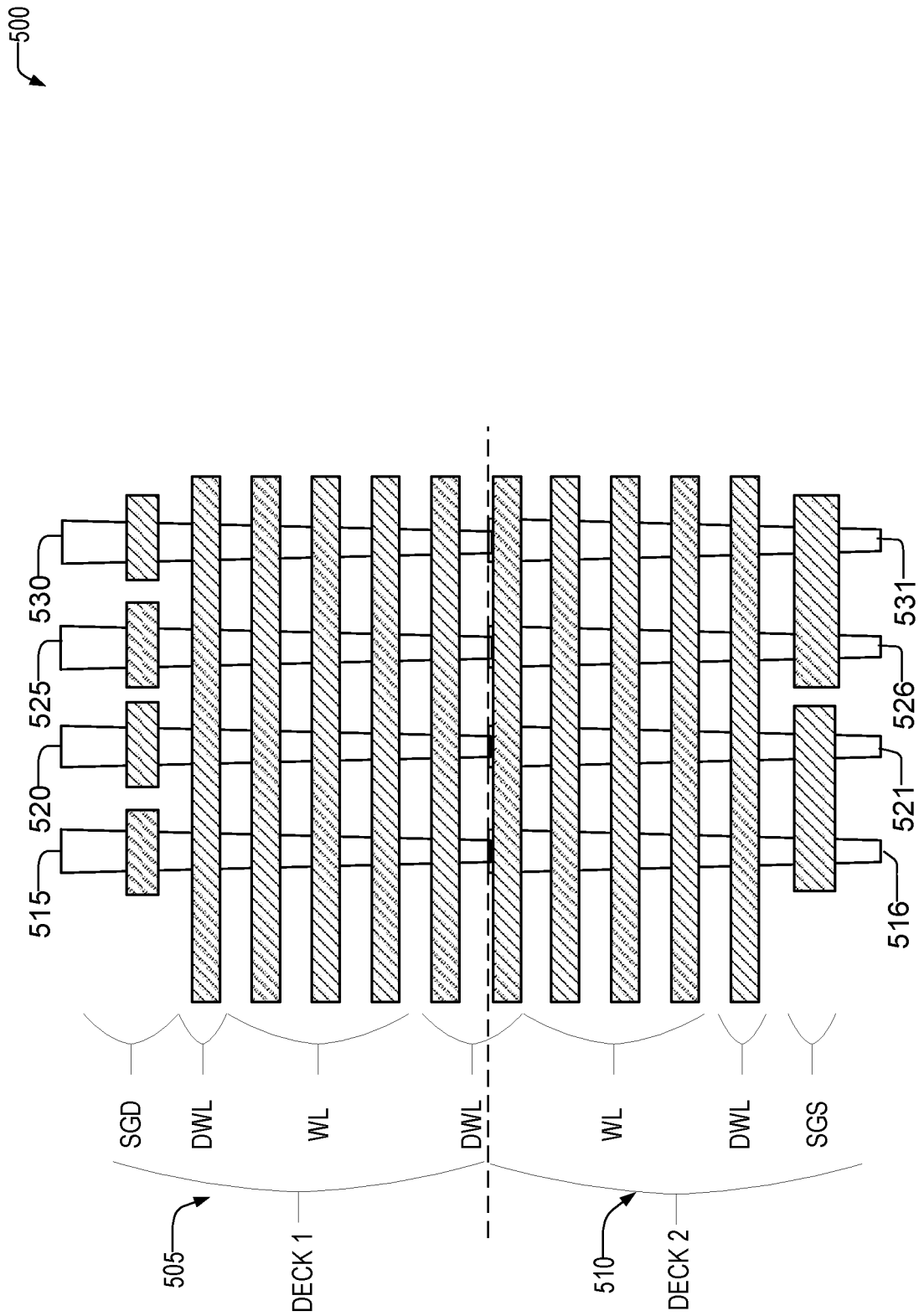
FIG. 5 illustrates a horizontal cross-section of a memory block according to some examples of the present disclosure.

FIG. 5 illustrates a horizontal cross-section of a memory block 500 according to some examples of the present disclosure. Memory block 500 may comprise a 3D NAND flash memory array where memory cells may be physically located in multiple levels such that memory cells may be stacked vertically on top of each other. Memory cells of the memory block 500 may be formed around shared common channel regions, such as regions 515, 516, 520, 521, 525, 526, 530, and 531 which may be formed as respective pillars of semiconductor material (e.g., polysilicon). Word lines (both data and dummy word lines) and select gates (including the SGD and SGS) may be formed from alternating layers of polysilicon and dielectric material. In some examples, the layers of polysilicon and dielectric material may be formed through deposition processes over a substrate. The structure of the memory cells around the pillars are shown in more detail in FIG. 6.

Memory block 500 may include two distinct portions or "decks" 505 and 510. Each deck has one or more data word lines, one or more dummy word lines (DWL), and one or more select gates that formed about a plurality of pillars. Deck 1 505 is formed around pillars 515, 520, 525, and 530. Deck 2 510 is formed around the pillars 516, 521, 526, and 531. The decks are separated from each other by one or more dummy word lines. Additionally, pillars of each deck may be electrically connected, for example, by a polysilicon plug or other connection. Thus, pillars 515 and 516 may be connected; pillars 520 and 521 may be connected; pillars 525 and 526 may be connected; and pillars 530 and 531 and so on. As shown, the memory block 500 includes three word lines per deck, 4 pillars per deck, and two decks 505 and 510, but in other examples, more or fewer word lines, pillars, and decks may be utilized and more than two decks may be utilized. A deck may be defined as a group of alternating levels of conductive material and dielectric material that form one or more wordlines that are separated from another group of alternating levels of conductive material and dielectric material that form one or more other wordlines by one or more dummy wordlines, one or more other separation layers, or the like. The pillars extending to the decks may be formed separately to each deck and connected or in some examples may be continuous. In some examples, dummy word lines are fully functional wordlines with memory cells that are not used to store host data.

Figure 6:
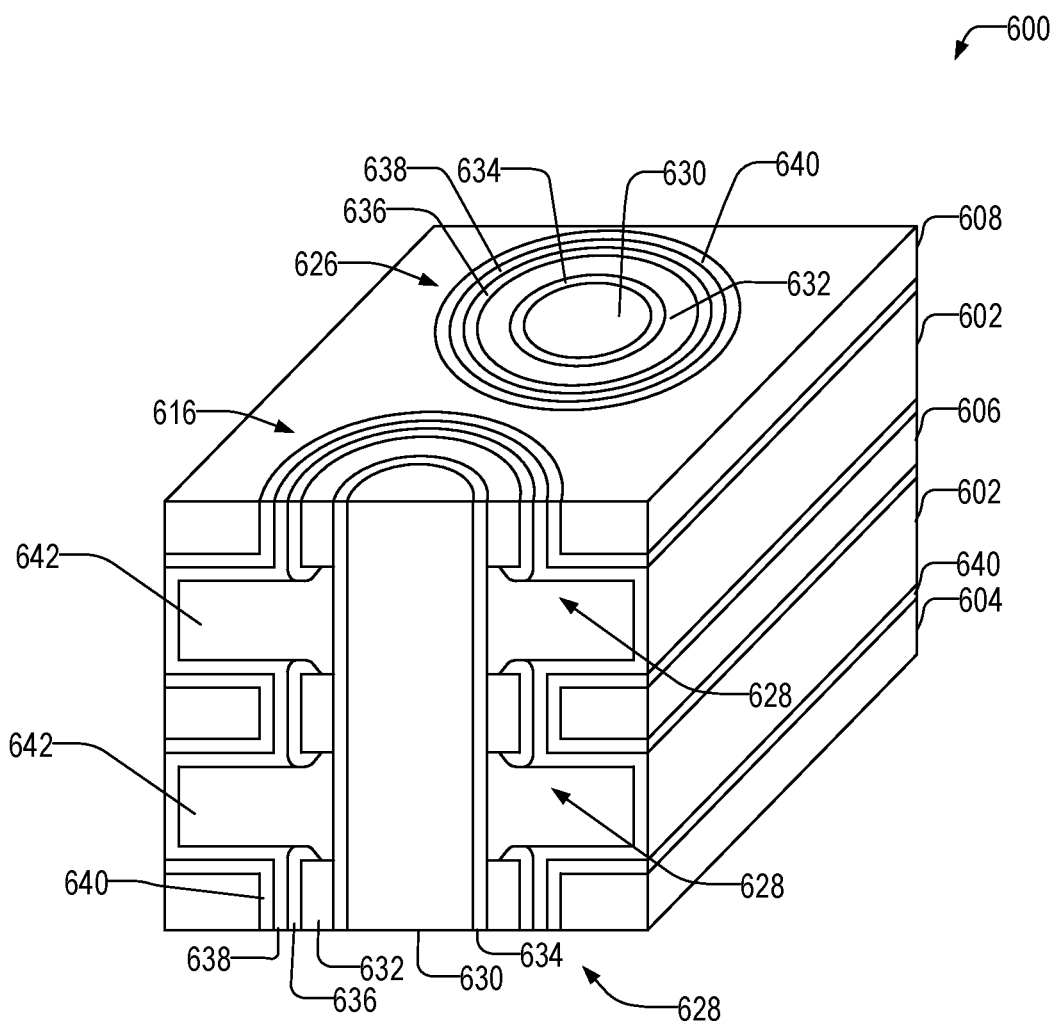
FIG. 6 illustrates an example three-dimensional cross section of a 3D NAND architecture semiconductor memory device according to some examples of the present disclosure.

FIG. 6 illustrates an example three-dimensional cross section of a 3D NAND architecture semiconductor memory device 600, including portions of two channels or pillars 616 and 626 (e.g., which could, for example, be an adjacent two of the channels 515, 516, 520, 521, 525, 526, 530, and 531 of FIG. 5); first, second, and third access lines 604, 606, 608 (which could be one or more wordlines from FIG. 5); and memory cells 628.

Each of the pillars 616, 626 includes a conductive structure 630, preferably a semiconductor material, such as polysilicon. In many examples, the polysilicon will define a central aperture, which will typically be filled with a dielectric material. The portions of the second and third pillars 616, 626 illustrated in FIG. 7 include three individual memory cells 628. Each 3D memory cell 628 includes a volume of semiconductor material, such as, in many examples, a partial ring structure 632 (e.g., p+ type polysilicon, etc.) that functions as a floating gate, separated from the polysilicon of the second and third pillars 616, 626 by a tunnel dielectric 634, and from respective first, second, or third access lines 604, 606, 608 by one or more inter-poly dielectric layers, such as an oxide-nitride-oxide (ONO) structure, including, for example, a first silicon dioxide ($SiO_2$) layer 636, a silicon nitride ($Si_3N_4$) layer 638, and a second dioxide layer 640. The respective memory cells 628 are separated from each other by additional tiers of dielectric material 642. Whereas the memory cells 628 in FIG. 6 include floating gate storage structures, in other examples, other charge storage mechanisms may be utilized, such as charge trapping structures or other forms of storage structures. The space between the conductive tiers 602 can include a dielectric material, such as silicon dioxide ($SiO_2$), or one or more other dielectric materials.

Figure 7:
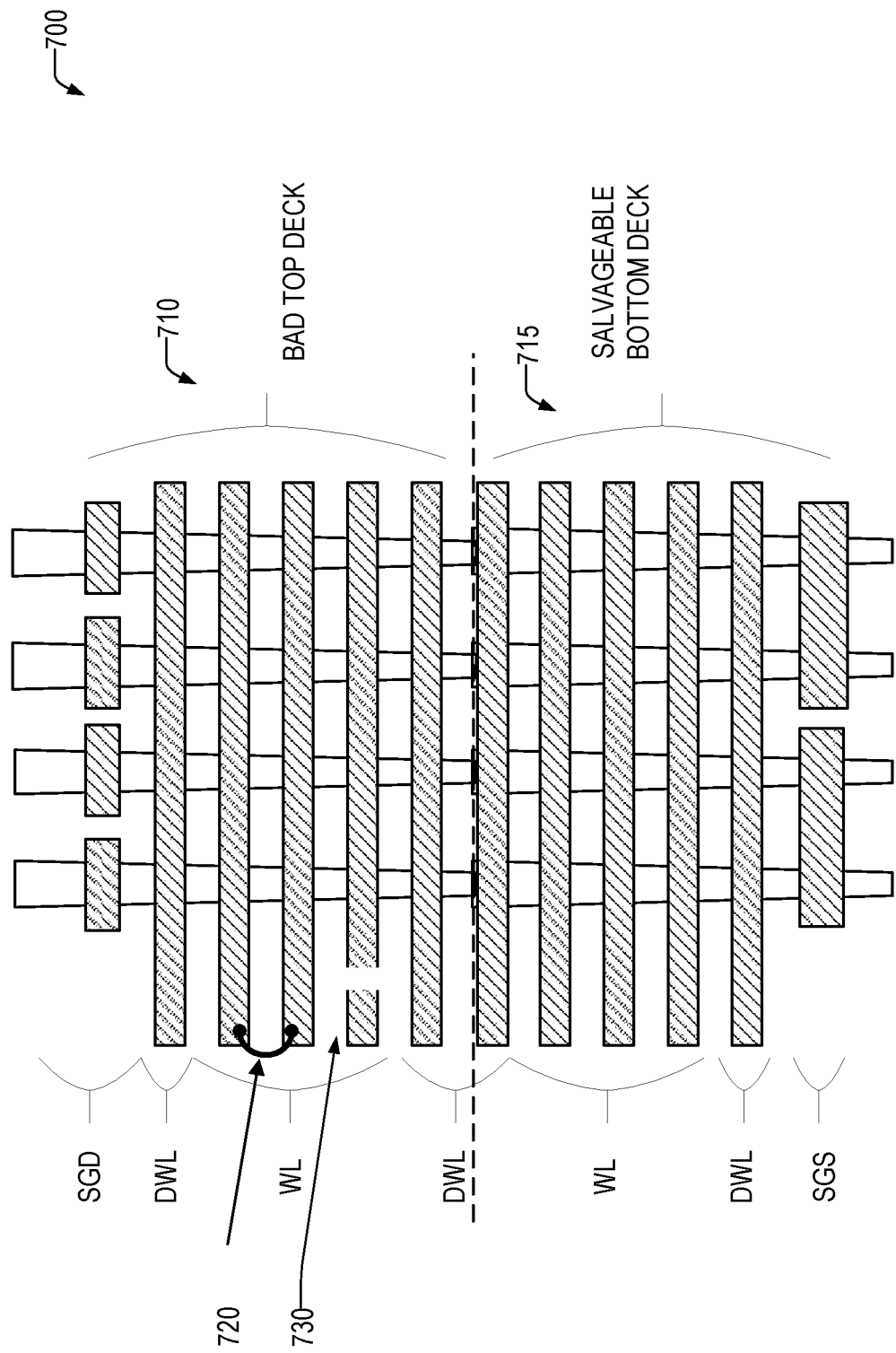
FIG. 7 illustrates a diagram of a memory block according to some examples of the present disclosure that illustrates defects in the top deck that still allows use of the bottom deck according to some examples of the present disclosure.

FIG. 7 illustrates a diagram of a memory block 700 according to some examples of the present disclosure that illustrates defects in the top deck 710 that still allows use of the bottom deck according to some examples of the present disclosure. A first defect 720 is a word line-to-word line short. For example, a defect in the dielectric material between word lines may allow for a short to develop between two word lines. A second defect is a resistive word line 730.

Normally either of these defects would make the entire memory block 700 unusable. However, in some examples, where the one deck has such defects and the other deck is not defective, the memory device may salvage the deck without defects by applying one or more compensation techniques to the bad deck to use the salvageable deck.

In the case of FIG. 7, the memory device may utilize the bottom deck 715 by application of bias voltages to the top deck 710 during operations to the bottom deck. The bottom deck 715 may thus be a salvageable deck that may be used to store user data, system data, system overprovisioning, or the like. As previously noted, a salvageable deck in some examples is a deck whose memory cells do not have a defect from a first group of defect types, but is part of a block in which at least one other deck has a defect from a second group of defect types. In some examples, the second group of defect types may include a word line-to-word line short, a resistive word line, a slow to program cell, and defects where a raw bit error rate (RBER) metric exceeds a threshold. In some examples, the first group of defect types include the second group of defect types and additional defect types such as word line to pillar shorts, SGS and SGD shorts, dummy word line shorts, and other defects that would typically cause the block to be marked as bad. As such, it will be appreciated by one of ordinary skill in the art with the benefit of the present disclosure that certain defects may allow a portion of the block to be salvaged, whereas other defects do not allow any portion of the block to be salvaged.

FIG. 7 shows the top deck as defective and the bottom deck as free of defects, but in other examples the top deck may be free of defects (and thus salvageable) but the bottom deck may have one or more defects. In still other examples, where the block has more than two decks, so long as a single deck is free of defects, the deck free of defects may be considered salvageable and may be utilized using one or more compensation techniques such as application of one or more bias voltages to the bad deck(s), the salvageable deck(s), or both.

Figure 8:
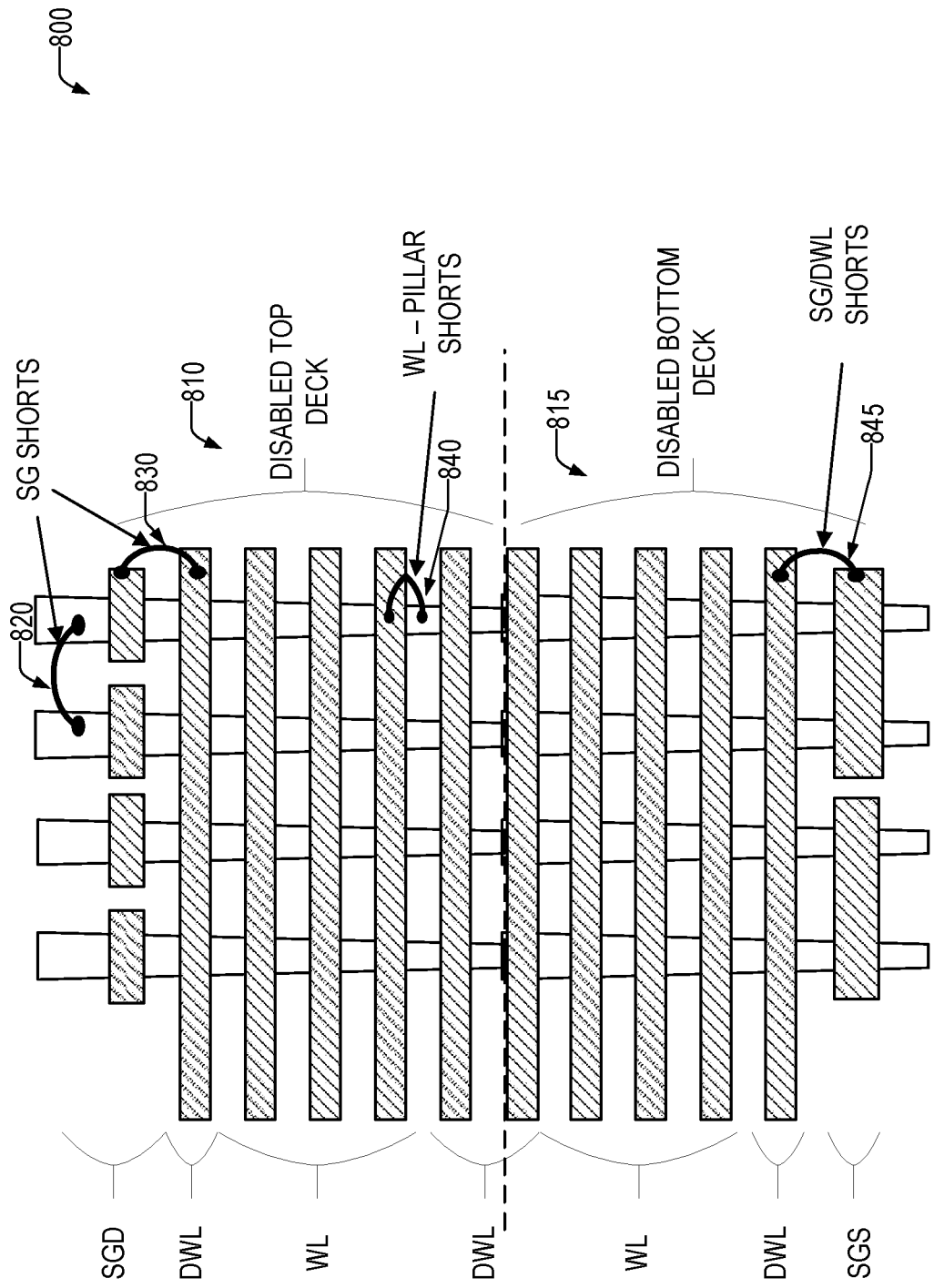
FIG. 8 illustrates a diagram of a memory block according to some examples of the present disclosure that show example defects in a top deck that do not allow the bottom deck to be salvaged according to some examples of the present disclosure.

Despite these improvements, as noted some defects do not allow the other deck to be salvaged. FIG. 8 illustrates a diagram of a memory block 800 according to some examples of the present disclosure that show example defects in one portion, a top deck 810, that do not allow any other portion—in this case, the bottom deck 815, to be salvaged. For example, shorts between the pillars 820, between a word line and a drain side select gate (SGD) 830, word line to pillar shorts 840, or shorts between a word line and a source side selected gate (SGS) 845. Both decks in blocks with these defects will be marked as bad, even if the defect exists only in one deck.

Figure 9:
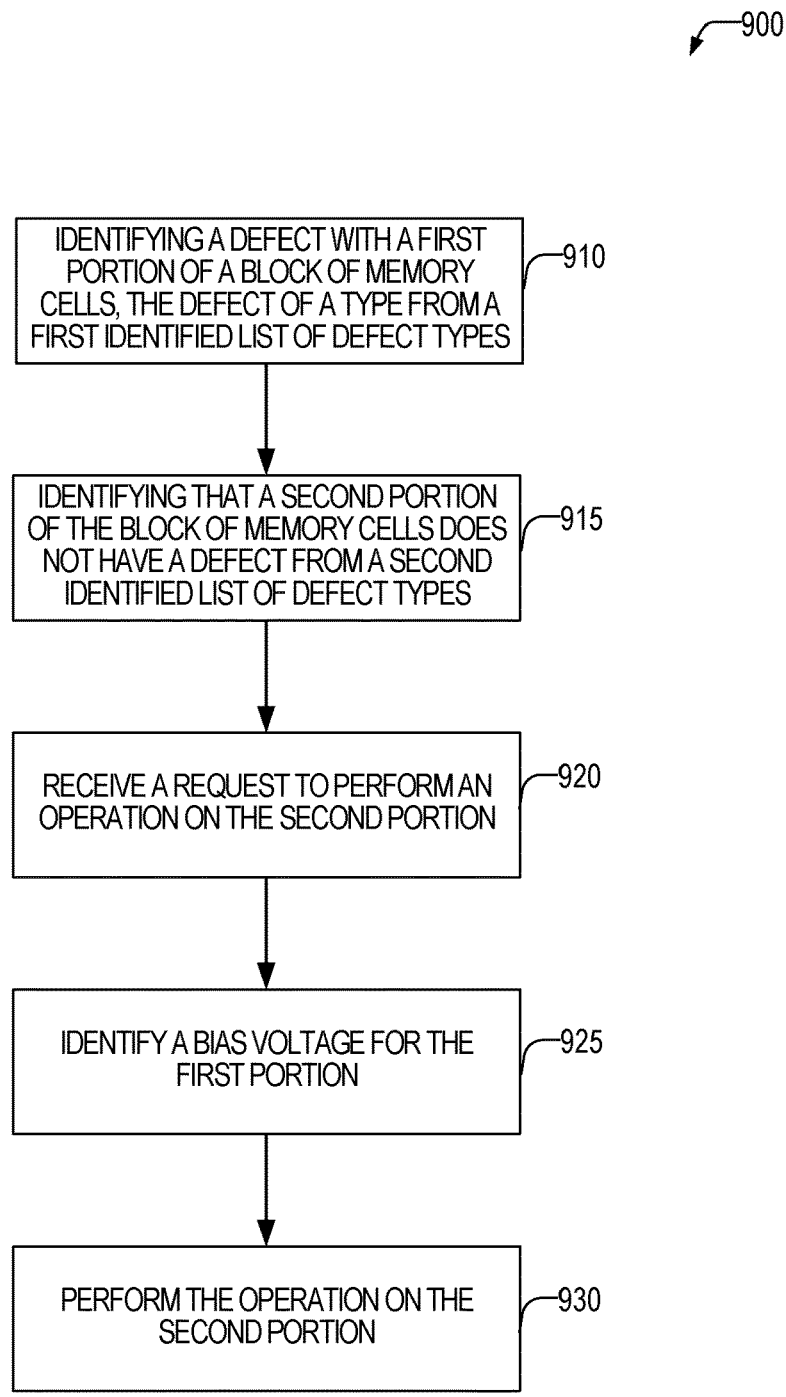
FIG. 9 illustrates a flowchart of a method of identifying a salvageable portion of a block of memory and utilizing the salvageable portion when a first portion is defective according to some examples of the present disclosure.

FIG. 9 illustrates a flowchart of a method 900 of identifying a salvageable portion of a block of memory and utilizing the salvageable portion when a first portion is defective according to some examples of the present disclosure. Method 900 may be performed by either, or both of a controller (such as controller 105) or by a memory control unit (such as memory control unit 430) on one or more memory dies (such as memory die 400, 130A-130N+1). At operation 910, a defect may be identified with a first portion of a block of memory cells that may allow another portion to be utilized, the defect being of a type from a first identified list of defect types. The first identified list may comprise word line to word line shorts in data word lines, slow to program word lines, wordlines that do not pass the RBFR requirements, and resistive wordlines. As noted, defects may be identified, for example, by one or more tests conducted on the memory cells. Example tests may include write tests, erase tests, read tests, and the like. The testing at operation 910 may be conducted after manufacturing and prior to putting the memory device in service. In other examples, the testing at operation 910 may be done during, or as a result of normal memory device operations. For example, by reading and/or writing particular memory cells and encountering errors during usage of the device a defect may be identified. The tests may be conducted by the memory device, by a testing device, or by both a memory device and a testing device.

At operation 915, the system may identify that a second portion of the block identified at operation 910 does not have a defect from a second identified list of defect types. For example, the second list of defect types may include the first list of defect types and other defects, such as word line to pillar shorts, SG shorts, and dummy word line shorts. In some examples, the second list of defect types may be any defect. In some examples, the second list of defect types may be any defect that renders the second portion unusable, even if compensation techniques are applied to the first portion.

Figure 10:
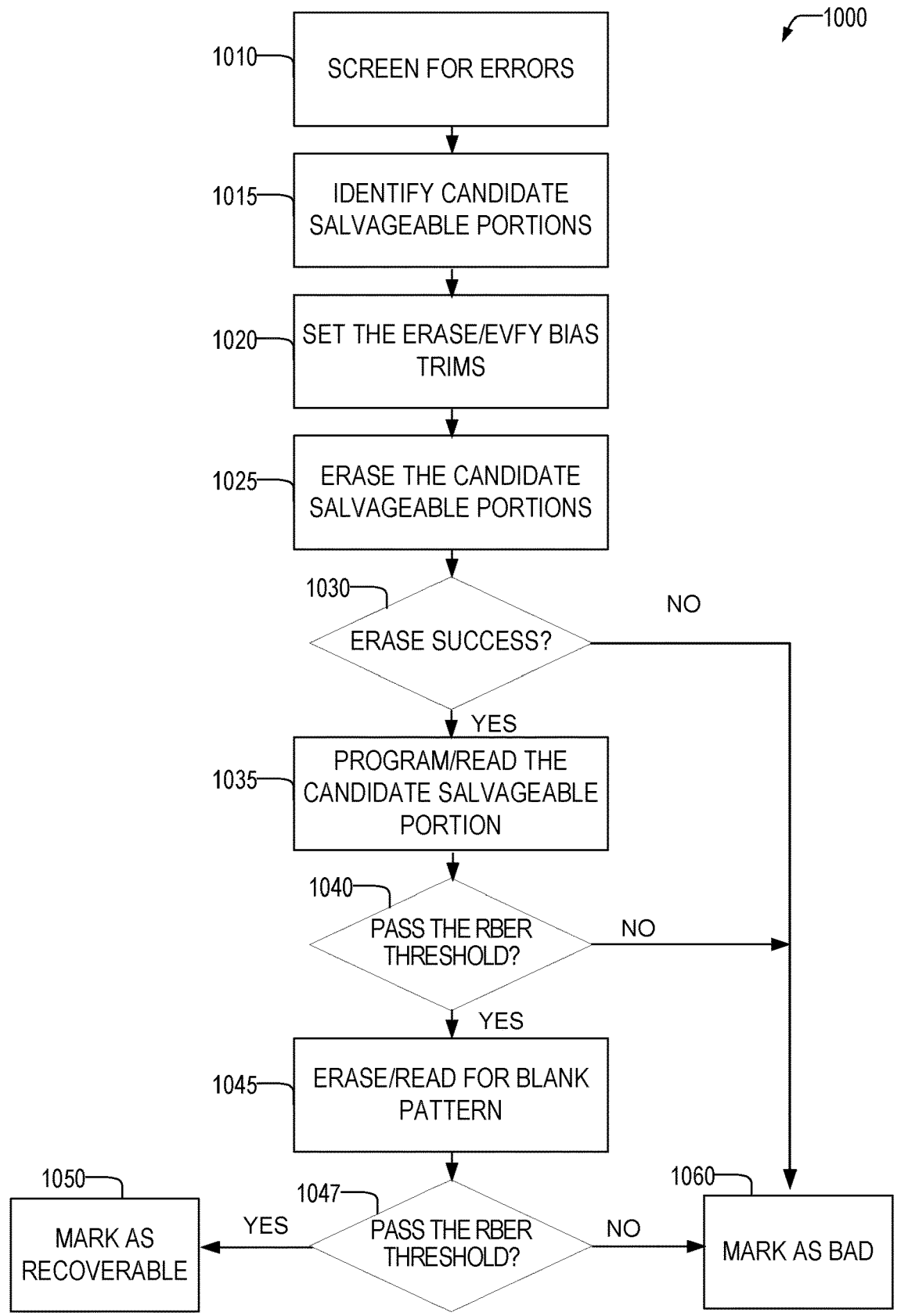
FIG. 10 illustrates a flowchart of a method of a determining block portions that are salvageable according to some examples of the present disclosure.

Responsive to identifying that there is a defect with a first portion at operation 910 and that a second portion does not have a defect at operation 915, the first portion may be marked defective by the memory device, and the second portion may be marked as salvageable. For example, the portions may be marked in a Logical-to-Physical (L2P) table in a controller, in the memory portion itself, in a table in a memory die that flags defective blocks and/or portions, a one-time programmable area, and the like. In some examples, both portions may initially be marked as "bad" and after turning on a particular feature to use the salvageable portions, the memory device may update the designation of each portion of each block that is marked as bad if there is a salvageable portion. In some examples, prior to marking the portion as salvageable, the system may test the second portion, e.g., as shown in FIG. 10.

At operation 920, the memory die may receive a request to perform an operation on the second portion (the salvageable portion). For example, the controller may determine that an operation is to be performed on the second portion and may request the memory die to perform the operation (e.g., by transmitting the request over an internal bus). Example operations may include erase operations, write operations, read operations, and the like. In some examples, the request may include an extra address bit from the controller that indicates which portion (e.g., deck) the operation is for. In other examples, such as those with two portions per block, the memory die may infer which portion the operation is for based upon which portion is marked as bad as indicated by one or more indicators stored within the memory die itself.

At operation 925, the memory die may select or identify the bias voltages to apply to word lines of the first portion when performing the operation on the second portion. For example, the memory die may identify or select the bias voltage, or the controller may select the bias voltage and communicate the appropriate bias voltage to the memory die. The selection of bias voltages may depend on the type of operation being performed (e.g., whether the operation is a read, write, or erase). For example, for an erase operation, the erase pulse phase may operate normally with equipotential on all wordlines across both the good and bad portions. The erase verify phase may apply uniform Vpass voltage for all wordlines in the bad deck to bypass the defect points with normal verify bias (low voltage) to confirm the passing or failing of the erase operation. Dummy word lines and SGD or SGS are kept the same as normal blocks. For read and program operations, all word lines in the bad decks are biased to an unselected word line voltage except dummy word lines and SGD/SGS which are kept the same. The selected bias voltages may be chosen so as to prevent the defects in the bad portion from interfering in the passing of electrical current to and from the memory cells associated to the word lines of the salvageable portion.

At operation 930 the memory die may perform the requested operation on the second portion. For example, by applying the one or voltages to one or more word lines, SGS, SGD, and the like to the second portion as well as applying the selected bias voltages to the first portion. For example, the memory die may read a value from the second portion, store a value in the second portion, erase the second portion, or the like.

FIG. 10 illustrates a flowchart of a method 1000 of a determining block portions that are salvageable according to some examples of the present disclosure. Method 1000 may be performed by either, or both of a controller (such as controller 105) or by a memory control unit (such as memory control unit 430) on one or more memory dies (such as memory die 400, 130A-130N+1). For example, and as demonstrated in the method 1000, the system may not only determine that an error exists in one portion but not in a second portion but may also verify the suitability of the second portion to ensure that it can reliably store data. While the operations of method 1000 include the operations of erasing, programming, and erasing and reading a blank pattern, it will be appreciated by one of ordinary skill in the art with the benefit of the present disclosure that more or fewer operations may be used to test the suitability of the second portion. For example, a system may only do an erase procedure and skip the remaining operations of FIG. 10. In other examples, the system may program and read the predetermined value and erase and read the blank pattern and skip the erase step at operation 1025. In yet other examples, additional suitability tests may be performed that are not shown in FIG. 10.

The operations of FIG. 10 may be performed for one or more blocks (e.g., all blocks) of one or more particular dies of a particular memory device. At operation 1010 the memory cells may be screened for errors. In some examples, after manufacturing, various tests may be conducted to find errors such as word line shorts, open word lines, and the like. In other examples, various tests may be conducted during operation of the memory device. The tests may be performed by the memory device (e.g., by a controller of the memory device), a testing device, or the like.

At operation 1015 the system may identify portions of blocks that are potentially salvageable from blocks that have other portions that have errors that were detected at operation 1010. These potentially salvageable block portions are termed candidate salvageable portions. Blocks that have certain types of specified errors on a first portion, but not on a second portion may be identified.

The remaining operation flow of FIG. 10 may be applied for one or more (or all) of the candidate salvageable portions identified in operation 1015. At operation 1020, the memory device may set the erase trims and the erase verify trims. For example, by setting the erase trims and the erase verify trims on the candidate salvageable portion and bias voltages on one or more of the other portions (e.g., the compensation techniques) of the block. At operation 1025, the candidate salvageable portions may be erased.

At operation 1030, it may be determined whether the erase operation succeeded. For example, the erase operation at operation 1025 may have a verify phase which verifies whether or not the erase succeeded. For example, the value of the cells may be read using a threshold voltage to ensure that a desired erased value is programmed into the cell. In some examples, the verify is only performed on the salvageable candidate portion. For any candidate salvageable portion where the erase did not succeed, then at operation 1060, the entire block corresponding to the particular candidate salvageable portion that failed may be marked as bad.

If the erase was successful, then at operation 1035 a prespecified value may be programmed into the candidate salvageable block portion—e.g., by applying the compensation techniques (e.g., the bias voltages) to the one or more bad portions of the block. The candidate salvageable block portion is then read and, at operation 1040, if a number of errors determined during a verification step are greater than a Raw Bit Error (RBER) threshold, the block is marked as bad at operation 1060. If the number of errors determined during the verification step is less than a RBER threshold, then at operation 1045, the candidate salvageable block portion may be erased and read for the blank pattern—again, by applying appropriate compensation techniques (e.g., bias voltages) to the bad portion of the block.

At operation 1047, the raw bit error rates (RBER) for the candidate salvageable portion for the read operation is determined and if the RBER is less than a threshold (which may be a same threshold as at operation 1040, or a different threshold), then at operation 1050, the candidate salvageable block portion is marked as salvageable, otherwise the entire block is marked as bad at operation 1060.

Usages of Salvageable Portions

Salvageable portions may be used in a variety of different ways depending on the system configuration and storage needs. Salvageable portions may be used in a physical mode. For example, data that may fit within the salvageable portion may be written to that salvageable portion. For example, system reserved data such as file system blocks. In some examples, salvageable portions used in physical mode to store system reserved data may be configured as SLC only.

Figure 11:
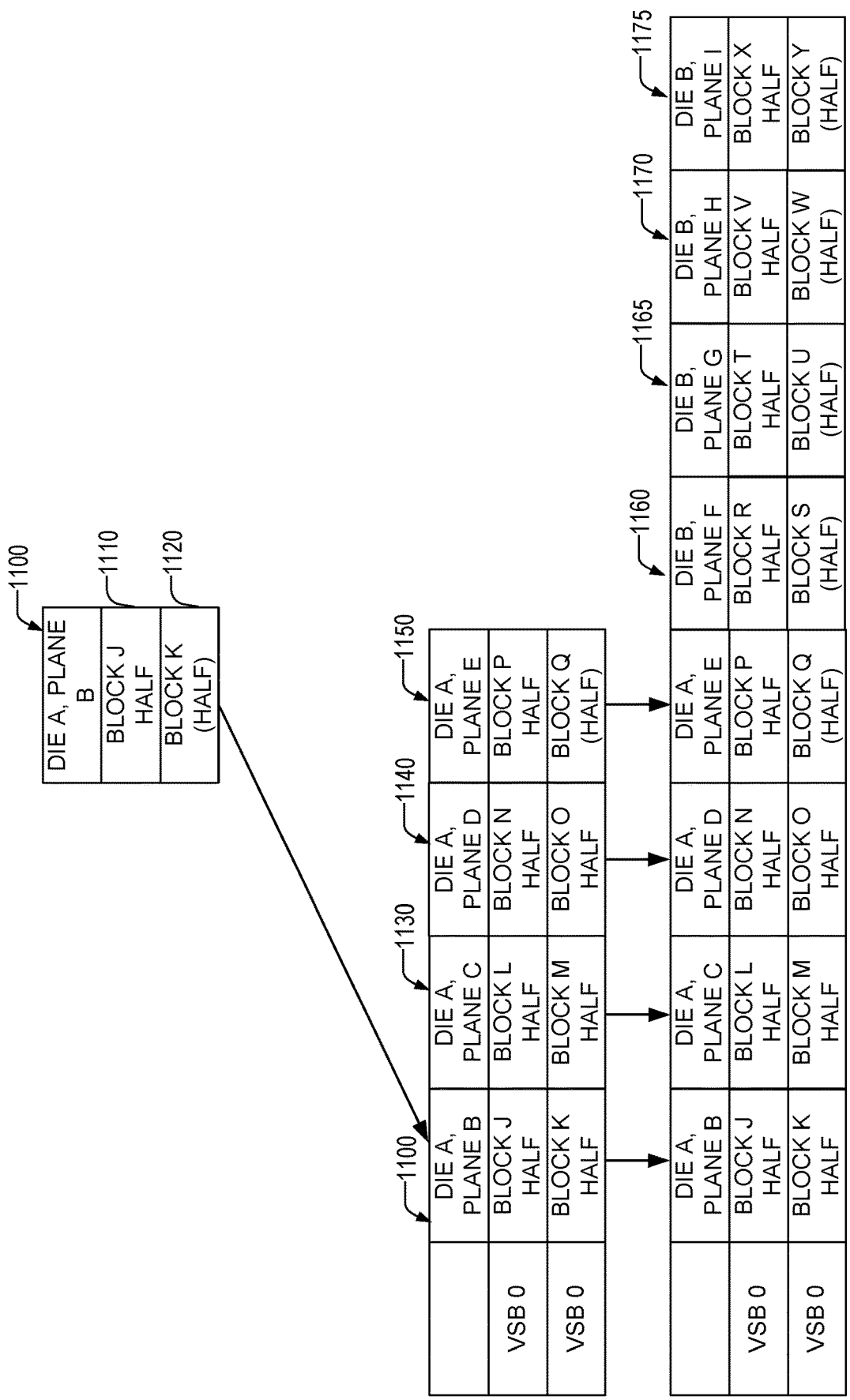
FIG. 11 illustrates composition of virtual structures from salvageable block portions according to some examples of the present disclosure.

In other examples, multiple salvageable portions may be used together to form a single virtual block on a single plane. For example, as shown in FIG. 11, a single plane virtual block 1100 may be composed of two salvageable block portions 1110 and 1120. These portions may be from a same die and a same plane. That is a first portion of a first block in a first die and a first plane may be paired with a different portion from the first block in a first die and the first plane. Data may be stored on this structure the same way data is stored on a regular block. The single plane virtual block 1100 may store system reserved data, system table blocks (e.g., L2P table blocks), user data blocks, and the like. These portions may be configured as SLC, MLC, TLC, QLC, or the like. A single plane virtual block may be two different salvageable portions from different blocks that are on a same plane.

In still other examples, multiple single plane virtual blocks may be combined to form multiplane virtual blocks. For example, multiple single plane virtual blocks 1100 may be paired together across multiple planes. For example, single plane virtual block 1100 may be combined with single plane virtual blocks 1130, 1140, and 1150 that are each on a different plane from each other. This allows the memory device to store data in a parallel fashion to take advantage of the abilities of the memory device to write to multiple planes simultaneously. A multiplane virtual block may be any virtual block formed of at least two single plane virtual blocks that reside on different planes. These portions may be configured as SLC, MLC, TLC, QLC, or the like. The multiplane virtual block may store system reserved data, system table blocks (e.g., L2P table blocks), user data blocks, and the like. While four single plane virtual blocks from four different planes are shown in FIG. 11, it will be appreciated by one of ordinary skill in the art that fewer or less single plane virtual blocks from fewer or less planes may be used. For example, five virtual blocks from five different planes. In other examples, multiple virtual blocks from a same plane may be included so long as at least one virtual block is from a different plane than at least one other virtual block.

Multiple multiplane virtual blocks that are on different dies may also be combined to form a multiplane, multi-die virtual block (called a virtual superblock or VSB). For example, in FIG. 11, the single plane virtual blocks 1100, 1130, 1140, and 1150 may be combined with virtual blocks 1160, 1165, 1170, and 1175. In these examples, data is striped across dies and planes to take advantage of both the ability of the memory device to write data in parallel to separate planes and dies, but also to safeguard data by writing portions of a same piece of data across dies. Because the data is written with an Error Correction Code, a single failure of a single die is correctable and will not result in loss of that data.

The block portions constituting the multiplane multidie virtual block may be configured as SLC, MLC, TLC, QLC, or the like. The multiplane multidie virtual block may store system reserved data, system table blocks (e.g., L2P table blocks), user data blocks, and the like. While two multiplane virtual blocks from two different dies are shown in FIG. 11, it will be appreciated by one of ordinary skill in the art that fewer or less multiplane virtual blocks from fewer or less dies may be used. For example, five multiplane virtual blocks from five different dies may form the multiplane multidie virtual block. In other examples, multiple multiplane virtual blocks from a same die may be included so long as at least one multiplane virtual block is from a different die than at least one other multiplane virtual block. In addition, as noted above, the multiplane virtual blocks making up the multiplane multidie virtual block may have varying configurations as discussed above.

Figure 12:
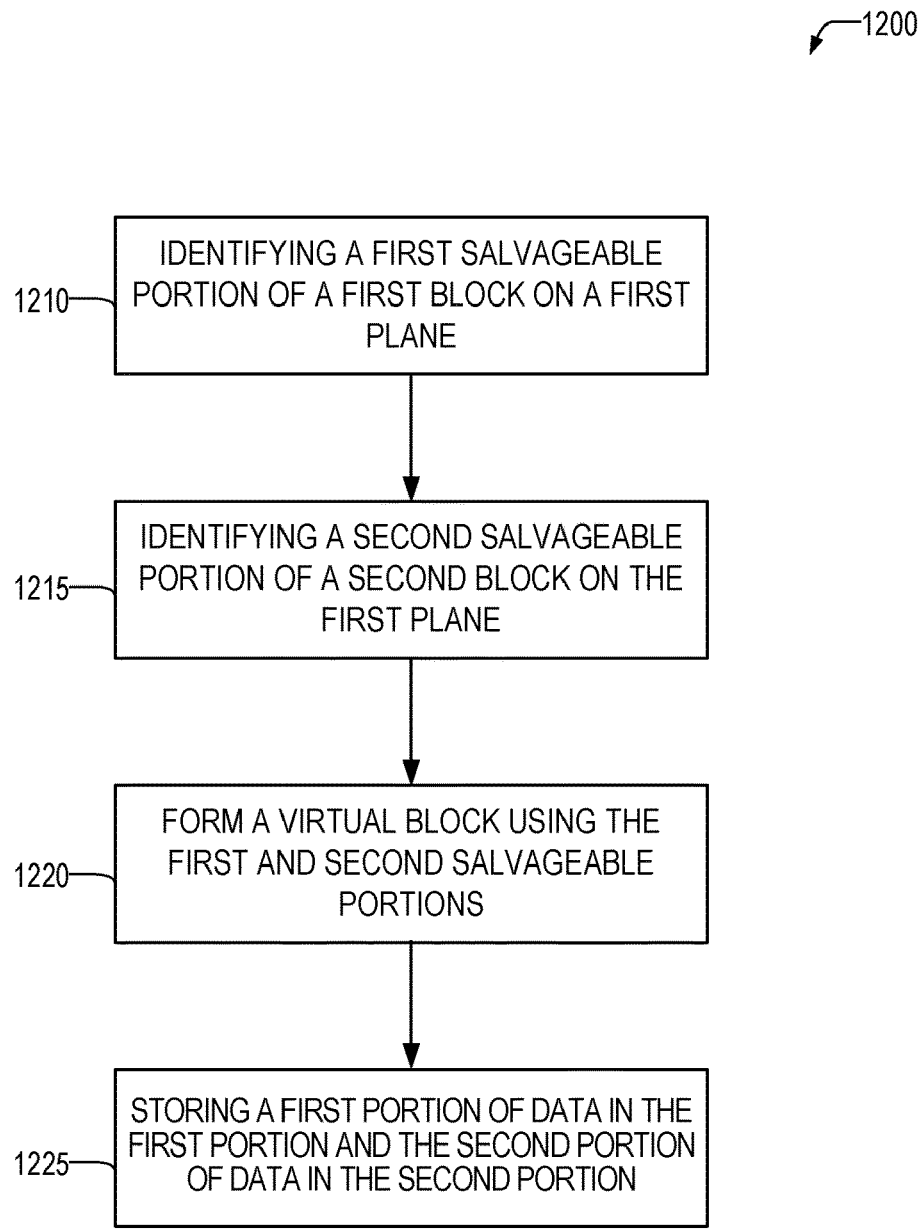
FIG. 12 illustrates a flowchart of a method of forming single plane virtual blocks from multiple salvageable block portions according to some examples of the present disclosure.

FIG. 12 illustrates a flowchart of a method 1200 of forming single plane virtual blocks from multiple salvageable block portions according to some examples of the present disclosure. Method 1200 may be performed by either, or both of a controller (such as controller 105) or by a memory control unit (such as memory control unit 430) on one or more memory dies (such as memory die 400, 130A-130N+1). The method 1200 may be performed when the memory device is put into service or may be performed dynamically at a later time. For example, if a block portion goes bad during usage and one or more block portions is salvageable, the salvageable portion may be combined with another salvageable portion during usage.

At operation 1210, a first salvageable portion of a first block on a first plane is identified. For example, using the flowchart of FIG. 10. At operation 1215, a second salvageable portion of a second block on the first plane is identified. For example, using the flowchart of FIG. 10.

At operation 1220, a virtual block may be created using the first and second salvageable portions. For example, the memory controller may store information on the makeup of virtual blocks in a data structure and insert the virtual block as a valid block. The logical to physical translation table that translates logical addresses to valid physical addresses may also be updated to reflect the availability of the virtual block and to indicate the proper addresses of the constituent parts of the virtual block.

At operation 1225, data may be stored in the virtual block by storing a first portion of data in the first portion and second portion of data in the second portion. The data may include host data received from a host; system data (e.g., a portion of the L2P table for example); system reserved data; data generated when performing a garbage collection operation; or the like. As previously described data may be written to, read from, salvageable portions by applying proper bias voltages to the bad portions on a same physical block as the salvageable portion where the operation is being performed on the salvageable portion.

Figure 13:
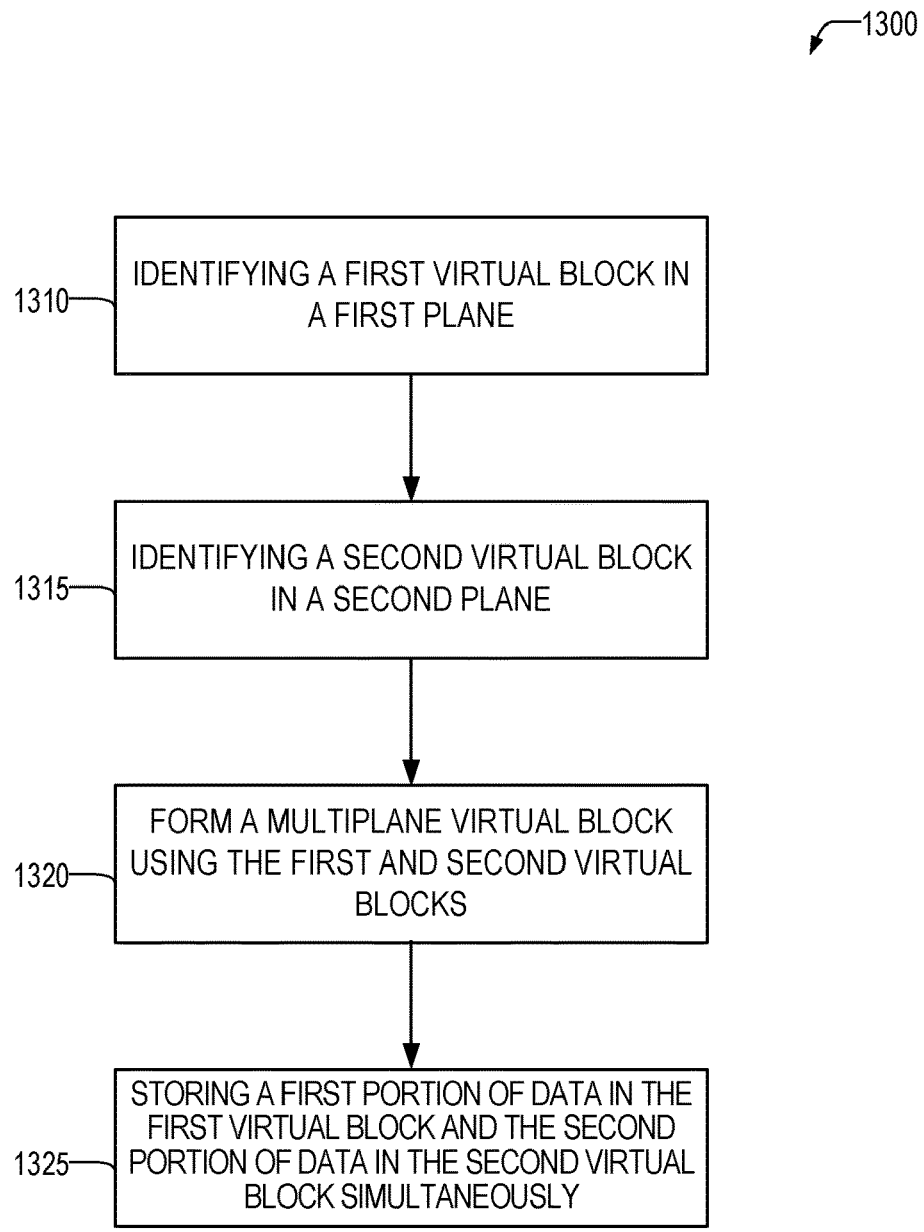
FIG. 13 illustrates a flowchart of a method of forming multiplane virtual blocks from multiple single plane virtual blocks according to some examples of the present disclosure.

Turning now to FIG. 13, a flowchart of a method 1300 of forming multiplane virtual blocks from multiple single plane virtual blocks is shown according to some examples of the present disclosure. Method 1300 may be performed by either, or both of a controller (such as controller 105) or by a memory control unit (such as memory control unit 430) on one or more memory dies (such as memory die 400, 130A-130N+1). At operation 1310 a first single plane virtual block on a first plane is identified. For example, using the process of FIG. 12. At operation 1315 a second virtual block on a second plane is identified. For example, using the process of FIG. 12. At operation 1320, a multiplane virtual block may be created from both the first and second virtual blocks identified in operations 1310 and 1315. For example, the memory controller may store information on the makeup of the multiplane virtual blocks in a data structure. For example, the logical to physical translation table that translates logical addresses to valid physical addresses may be used. At operation 1325, a first portion of data may be stored in the first virtual block and a second portion stored in the second virtual block simultaneously. That is, because the first virtual block is in the first plane and the second virtual block is in the second plane, a write or read operation on the first virtual block may be performed simultaneously or near-simultaneously with a write or read operation on the second virtual block.

Figure 14:
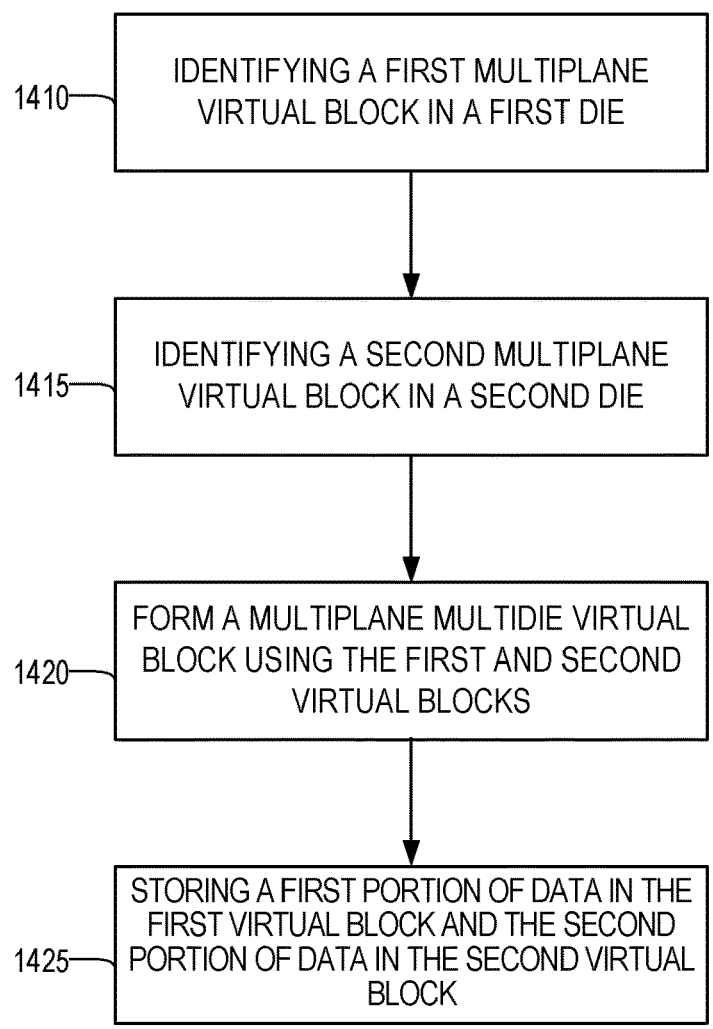
FIG. 14 illustrates a flowchart of a method of forming multiplane multidie virtual blocks from multiple multiplane virtual blocks according to some examples of the present disclosure.

Turning now to FIG. 14, a flowchart of a method 1400 of forming multiplane multidie virtual blocks from multiple multiplane virtual blocks is shown according to some examples of the present disclosure. Method 1400 may be performed by either, or both of a controller (such as controller 105) or by a memory control unit (such as memory control unit 430) on one or more memory dies (such as memory die 400, 130A-130N+1). At operation 1410 a first multiplane virtual block on a first die is identified. For example, using the process of FIG. 13. At operation 1415 a second multiplane virtual block on a second die is identified. For example, using the process of FIG. 13. At operation 1420, a multiplane multidie virtual block may be created from both the first and second multiplane virtual blocks identified in operations 1410 and 1415. For example, the memory controller may store information on the makeup of the multiplane multidie virtual blocks in a data structure. For example, the logical to physical translation table that translates logical addresses to valid physical addresses may be used. At operation 1425, a first portion of data may be stored in the first virtual block and a second portion stored in the second virtual block simultaneously. For example, data may be striped across dies and across planes within each die.

As previously noted, using salvageable portions of memory blocks marked as defective happen automatically, but in other examples, this may be a feature that may be enabled—either during device setup and/or initialization or during runtime. For example, blocks that are salvageable may be marked as salvageable after manufacturing during initial testing, but not enabled. The salvageable blocks may be enabled once a number of initially good blocks are marked as bad (e.g., they have degraded from use and the data thereon fails decoding of error correction coding (ECC) a threshold number of times). This allows the memory device to continue to store the advertised capacity for longer and thus increases the service life of the memory device. For example, the newly available salvageable blocks may be used to store user data, used for overprovisioning, used for temporary storage (such as during garbage collection), used for system data, or the like. The use of salvageable portions may be enabled by logic on the memory die itself, enabled by a controller of the memory device, a host, or the like. Once activated, the memory die or the controller may add the previously identified salvageable portions to a logical-to-physical mapping table as an available block or block portion. In some examples, as previously described the controller may form virtual blocks with one or more multiple block portions as described with respect to FIGS. 11-14. In still other examples, all portions are initially marked bad and once the feature is enabled, the system may determine which portions are salvageable and enable those portions.

As previously described, while the Figures had two portions (decks) and one was salvageable, in other examples, the memory die may have more than two portions (e.g., three decks) and more than one may be salvageable. In still other examples, a memory die may have only one deck, but portions may be other portions of the deck, such as sub-blocks, or the like.

Methods shown in FIGS. 9,10,12-14 may be implemented by dedicated hardware configured to perform the methods, software on general purpose processors configured to cause the general purpose processors to perform the methods, or a combination of dedicated hardware and software. In implementations that are based upon software, the instructions may be stored on a computer-readable or machine-readable medium (which may be non-transitory). The instructions, which when executed, cause a processor or other hardware to execute operations to perform the methods.

Figure 15:
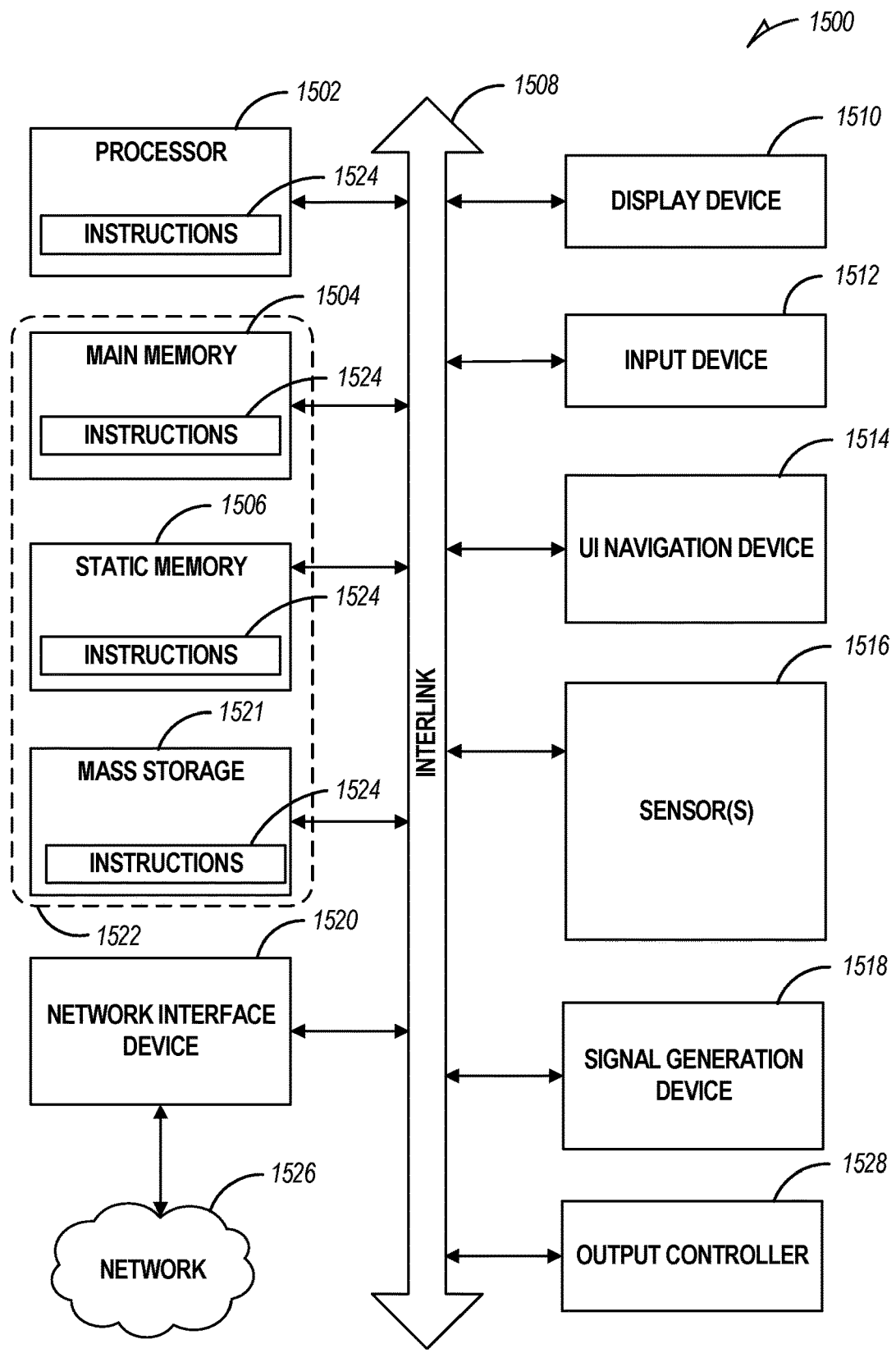
FIG. 15 illustrates a block diagram of an example machine upon which any one or more of the techniques (e.g., methodologies) discussed herein may be performed.

FIG. 15 illustrates a block diagram of an example machine 1500 upon which any one or more of the techniques (e.g., methodologies) discussed herein may be performed. Machine 1500 or one or more components of machine 1500 may implement one or more of the memory devices or components of memory devices described herein. For example, machine 1500 or one or more components of machine 1500 may implement the memory device 100. In some examples, the machine 1500 may be a host device 135. In some examples, main memory 1504, static memory 1506, and/or mass storage 1521 may be implemented through memory such as those discussed relative to FIGS. 1-12 herein.

In alternative embodiments, the machine 1500 can operate as a standalone device or can be connected (e.g., networked) to other machines. In a networked deployment, the machine 1500 can operate in the capacity of a memory device, a host device, a server machine, a client machine, or both in server-client network environments. In an example, the machine 1500 can act as a peer machine in peer-to-peer (P2P) (or other distributed) network environment. The machine 1500 can be a personal computer (PC), a tablet PC, a set-top box (STB), a personal digital assistant (PDA), a mobile telephone, a web appliance, an IoT device, automotive system, a host device, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms (hereinafter "modules"). Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer system) 1500 (e.g., the host device 135, the memory device 100, etc.) can include a hardware processor 1502 (e.g., a central processing unit (CPU), a graphics processing unit (GPU), a hardware processor core, or any combination thereof, etc.), a main memory 1504 and a static memory 1506, some or all of which can communicate with each other via an interlink (e.g., bus) 1508. The machine 1500 can further include a display unit 1510, an alphanumeric input device 1512 (e.g., a keyboard), and a user interface (UI) navigation device 1514 (e.g., a mouse). In an example, the display unit 1510, input device 1512 and UI navigation device 1514 can be a touch screen display. The machine 1500 can additionally include a storage device (e.g., mass storage 1521), a signal generation device 1518 (e.g., a speaker), a network interface device 1520, and one or more sensors 1516, such as a global positioning system (GPS) sensor, compass, accelerometer, or other sensor. The machine 1500 can include an output controller 1528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1521 can include a machine readable medium 1522 on which is stored one or more sets of data structures or instructions 1524 (e.g., software) embodying or utilized by any one or more of the techniques or functions described herein. The instructions 1524 can also reside, completely or at least partially, within the main memory 1504, within static memory 1506, or within the hardware processor 1502 during execution thereof by the machine 1500. In an example, one or any combination of the hardware processor 1502, the main memory 1504, the static memory 1506, or the storage device 1521 can constitute the machine readable medium 1522.

While the machine readable medium 1522 is illustrated as a single medium, the term "machine readable medium" can include a single medium or multiple media (e.g., a centralized or distributed database, or associated caches and servers) configured to store the one or more instructions 1524.

The term "machine readable medium" can include any medium capable of storing, encoding, or carrying instructions for execution by the machine 1500 and that cause the machine 1500 to perform any one or more of the techniques of the present disclosure, or capable of storing, encoding or carrying data structures used by or associated with such instructions. Non-limiting machine readable medium examples can include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1524 (e.g., software, programs, an operating system (OS), etc.) or other data are stored on the storage device 1521, can be accessed by the memory 1504 for use by the processor 1502. The memory 1504 (e.g., DRAM) is typically fast, but volatile, and thus a different type of storage than the storage device 1521 (e.g., an SSD), which is suitable for long-term storage, including while in an "off" condition. The instructions 1524 or data in use by a user or the machine 1500 are typically loaded in the memory 1504 for use by the processor 1502. When the memory 1504 is full, virtual space from the storage device 1521 can be allocated to supplement the memory 1504; however, because the storage 1521 device is typically slower than the memory 1504, and write speeds are typically at least twice as slow as read speeds, use of virtual memory can greatly reduce user experience due to storage device latency (in contrast to the memory 1504, e.g., DRAM). Further, use of the storage device 1521 for virtual memory can greatly reduce the usable lifespan of the storage device 1521.

In contrast to virtual memory, virtual memory compression (e.g., the Linux® kernel feature "ZRAM") uses part of the memory as compressed block storage to avoid paging to the storage device 1521. Paging takes place in the compressed block until it is necessary to write such data to the storage device 1521. Virtual memory compression increases the usable size of memory 1504, while reducing wear on the storage device 1521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1524 can further be transmitted or received over a communications network 1526 using a transmission medium via the network interface device 1520 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, peer-to-peer (P2P) networks, among others. In an example, the network interface device 1520 can include one or more physical jacks (e.g., Ethernet, coaxial, or phone jacks) or one or more antennas to connect to the communications network 1526. In an example, the network interface device 1520 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1500, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

In some embodiments described herein, different doping configurations can be applied to a source-side select gate (SGS), a control gate (CG), and a drain-side select gate (SGD), each of which, in this example, can be formed of or at least include polysilicon, with the result such that these tiers (e.g., polysilicon, etc.) can have different etch rates when exposed to an etching solution. For example, in a process of forming a monolithic pillar in a 3D semiconductor device, the SGS and the CG can form recesses, while the SGD can remain less recessed or even not recessed. These doping configurations can thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a method for salvaging portions of defective blocks of a memory device, the method comprising: receiving a request to perform an operation on a second portion of a block of memory cells, a first portion of the block of memory cells having a defect of a type from a first identified list of defect types and the second portion not having a defect of a type from a second identified list of defect types, the second identified set of defect types including the first identified set of defect types; identifying a bias voltage for the first portion of the block based upon the type of operation; performing the operation on the second portion, the performing the operation comprising disabling the first portion during the operation by applying a bias voltage to word lines of the first portion.

In Example 2, the subject matter of Example 1 includes, wherein the first portion is a first deck of the block and the second portion is a second deck of the block.

In Example 3, the subject matter of Examples 1-2 includes, wherein the defect comprises a short between two or more wordlines.

In Example 4, the subject matter of Examples 1-3 includes, wherein the defect comprises a resistive wordline.

In Example 5, the subject matter of Examples 1-4 includes, wherein the operation is one of: storing host data in the second portion, reading host data from the second portion, or erasing the second portion.

In Example 6, the subject matter of Examples 1-5 includes, wherein identifying the defect with the first portion comprises determining that the defect exists based upon an error rate of the first portion during operation.

In Example 7, the subject matter of Examples 1-6 includes, wherein performing an operation on the second portion comprises decoding an address bit of a request message, the address bit specifying the portion of the block of memory cells to apply the operation to.

Example 8 is a memory device comprising: a processor; a memory, storing instructions, which when executed, causes the processor to perform operations comprising: receiving a request to perform an operation on a second portion of a block of memory cells, a first portion of the block of memory cells having a defect of a type from a first identified list of defect types and the second portion not having a defect of a type from a second identified list of defect types, the second identified set of defect types including the first identified set of defect types; identifying a bias voltage for the first portion of the block based upon the type of operation; performing the operation on the second portion, the performing the operation comprising disabling the first portion during the operation by applying a bias voltage to word lines of the first portion.

In Example 9, the subject matter of Example 8 includes, wherein the first portion is a first deck of the block and the second portion is a second deck of the block.

In Example 10, the subject matter of Examples 8-9 includes, wherein the defect comprises a short between two or more wordlines.

In Example 11, the subject matter of Examples 8-10 includes, wherein the defect comprises a resistive wordline.

In Example 12, the subject matter of Examples 8-11 includes, wherein the operation performed on the second portion is one of: storing host data in the second portion, reading host data from the second portion, or erasing the second portion.

In Example 13, the subject matter of Examples 8-12 includes, wherein the operations of identifying the defect with the first portion comprises determining that the defect exists based upon an error rate of the first portion during operation.

In Example 14, the subject matter of Examples 8-13 includes, wherein the operations of performing an operation on the second portion comprises decoding an address bit of a request message, the address bit specifying the portion of the block of memory cells to apply the operation to.

Example 15 is a machine-readable storage medium, storing instructions, which when executed, cause a machine to perform operations comprising: receiving a request to perform an operation on a second portion of a block of memory cells, a first portion of the block of memory cells having a defect of a type from a first identified list of defect types and the second portion not having a defect of a type from a second identified list of defect types, the second identified set of defect types including the first identified set of defect types; identifying a bias voltage for the first portion of the block based upon the type of operation; performing the operation on the second portion, the performing the operation comprising disabling the first portion during the operation by applying a bias voltage to word lines of the first portion.

In Example 16, the subject matter of Example 15 includes, wherein the first portion is a first deck of the block and the second portion is a second deck of the block.

In Example 17, the subject matter of Examples 15-16 includes, wherein the defect comprises a short between two or more wordlines.

In Example 18, the subject matter of Examples 15-17 includes, wherein the defect comprises a resistive wordline.

In Example 19, the subject matter of Examples 15-18 includes, wherein the operation performed on the second portion is one of: storing host data in the second portion, reading host data from the second portion, or erasing the second portion.

In Example 20, the subject matter of Examples 15-19 includes, wherein the operations of identifying the defect with the first portion comprises determining that the defect exists based upon an error rate of the first portion during operation.

In Example 21, the subject matter of Examples 15-20 includes, wherein the operations of performing an operation on the second portion comprises decoding an address bit of a request message, the address bit specifying the portion of the block of memory cells to apply the operation to.

Example 22 is a memory device comprising: means for receiving a request to perform an operation on a second portion of a block of memory cells, a first portion of the block of memory cells having a defect of a type from a first identified list of defect types and the second portion not having a defect of a type from a second identified list of defect types, the second identified set of defect types including the first identified set of defect types; means for identifying a bias voltage for the first portion of the block based upon the type of operation; means for performing the operation on the second portion, the performing the operation comprising disabling the first portion during the operation by applying a bias voltage to word lines of the first portion.

In Example 23, the subject matter of Example 22 includes, wherein the first portion is a first deck of the block and the second portion is a second deck of the block.

In Example 24, the subject matter of Examples 22-23 includes, wherein the defect comprises a short between two or more wordlines.

In Example 25, the subject matter of Examples 22-24 includes, wherein the defect comprises a resistive wordline.

In Example 26, the subject matter of Examples 22-25 includes, wherein the operation is one of: storing host data in the second portion, reading host data from the second portion, or erasing the second portion.

In Example 27, the subject matter of Examples 22-26 includes, wherein the means for identifying the defect with the first portion comprises means for determining that the defect exists based upon an error rate of the first portion during operation.

In Example 28, the subject matter of Examples 22-27 includes, wherein the means for performing an operation on the second portion comprises means for decoding an address bit of a request message, the address bit specifying the portion of the block of memory cells to apply the operation to.

Example 29 is a method for salvaging portions of blocks of memory cells of a memory device, the method comprising: identifying a first portion of a first NAND block in the memory device that has a defect of a type in a first identified list of defect types in the first portion and a second portion of the first NAND block that does not have a defect from a second identified list of defect types; identifying a first portion of a second NAND block in the memory device that has a defect of a type in the first identified list of defect types in the first portion and a second portion of the second NAND block that does not have a defect from the second identified list of defect types; forming a virtual block using the second portion of the first NAND block and the second portion of the second NAND block; and storing data in the virtual block by storing a first portion of the data in the second portion of the first NAND block and a second portion of the data in the second portion of the second NAND block.

In Example 30, the subject matter of Example 29 includes, wherein forming the virtual block comprises creating a table entry in a L2P table indicating that the first and second portions form a virtual block.

In Example 31, the subject matter of Examples 29-30 includes, grouping a second virtual block with the virtual block and storing a third portion of data in the second virtual block.

In Example 32, the subject matter of Example 31 includes, selecting the second virtual block based upon the second virtual block being on a different plane than the virtual block, and wherein the storing the third portion of data occurs concurrently with the storing the first portion of data.

In Example 33, the subject matter of Example 32 includes, grouping the first and second virtual blocks with a third virtual block, the third virtual block being on a different die than the first and second virtual blocks.

In Example 34, the subject matter of Examples 29-33 includes, wherein the data is host data received from a host.

In Example 35, the subject matter of Examples 29-34 includes, wherein the data is system data.

In Example 36, the subject matter of Examples 34-35 includes, wherein the system data is a portion of a logical to physical translation table.

Example 37 is a memory device comprising: a processor; a memory, storing instructions, which when executed, causes the processor to perform operations comprising: identifying a first portion of a first NAND block in the memory device that has a defect of a type in a first identified list of defect types in the first portion and a second portion of the first NAND block that does not have a defect from a second identified list of defect types; identifying a first portion of a second NAND block in the memory device that has a defect of a type in the first identified list of defect types in the first portion and a second portion of the second NAND block that does not have a defect from the second identified list of defect types; forming a virtual block using the second portion of the first NAND block and the second portion of the second NAND block; and storing data in the virtual block by storing a first portion of the data in the second portion of the first NAND block and a second portion of the data in the second portion of the second NAND block.

In Example 38, the subject matter of Example 37 includes, wherein the operations of forming the virtual block comprises creating a table entry in a L2P table indicating that the first and second portions form a virtual block.

In Example 39, the subject matter of Examples 37-38 includes, wherein the operations further comprise grouping a second virtual block with the virtual block and storing a third portion of data in the second virtual block.

In Example 40, the subject matter of Example 39 includes, wherein the operations further comprise selecting the second virtual block based upon the second virtual block being on a different plane than the virtual block, and wherein the operations of storing the third portion of data occurs concurrently with the storing the first portion of data.

In Example 41, the subject matter of Example 40 includes, wherein the operations further comprise grouping the first and second virtual blocks with a third virtual block, the third virtual block being on a different die than the first and second virtual blocks.

In Example 42, the subject matter of Examples 37-41 includes, wherein the data is host data received from a host.

In Example 43, the subject matter of Examples 37-42 includes, wherein the data is system data.

In Example 44, the subject matter of Examples 42-43 includes, wherein the system data is a portion of a logical to physical translation table.

Example 45 is a machine-readable medium, storing instructions, which when executed by a machine, cause the machine to perform operations comprising: identifying a first portion of a first NAND block in the memory device that has a defect of a type in a first identified list of defect types in the first portion and a second portion of the first NAND block that does not have a defect from a second identified list of defect types; identifying a first portion of a second NAND block in the memory device that has a defect of a type in the first identified list of defect types in the first portion and a second portion of the second NAND block that does not have a defect from the second identified list of defect types; forming a virtual block using the second portion of the first NAND block and the second portion of the second NAND block; and storing data in the virtual block by storing a first portion of the data in the second portion of the first NAND block and a second portion of the data in the second portion of the second NAND block.

In Example 46, the subject matter of Example 45 includes, wherein the operations of forming the virtual block comprises creating a table entry in a L2P table indicating that the first and second portions form a virtual block.

In Example 47, the subject matter of Examples 45-46 includes, wherein the operations further comprise grouping a second virtual block with the virtual block and storing a third portion of data in the second virtual block.

In Example 48, the subject matter of Example 47 includes, wherein the operations further comprise selecting the second virtual block based upon the second virtual block being on a different plane than the virtual block, and wherein the operations of storing the third portion of data occurs concurrently with the storing the first portion of data.

In Example 49, the subject matter of Example 48 includes, wherein the operations further comprise grouping the first and second virtual blocks with a third virtual block, the third virtual block being on a different die than the first and second virtual blocks.

In Example 50, the subject matter of Examples 45-49 includes, wherein the data is host data received from a host.

In Example 51, the subject matter of Examples 45-50 includes, wherein the data is system data.

In Example 52, the subject matter of Examples 50-51 includes, wherein the system data is a portion of a logical to physical translation table.

Example 53 is a memory device comprising: means for identifying a first portion of a first NAND block in the memory device that has a defect of a type in a first identified list of defect types in the first portion and a second portion of the first NAND block that does not have a defect from a second identified list of defect types; means for identifying a first portion of a second NAND block in the memory device that has a defect of a type in the first identified list of defect types in the first portion and a second portion of the second NAND block that does not have a defect from the second identified list of defect types; means for forming a virtual block using the second portion of the first NAND block and the second portion of the second NAND block; and means for storing data in the virtual block by storing a first portion of the data in the second portion of the first NAND block and a second portion of the data in the second portion of the second NAND block.

In Example 54, the subject matter of Example 53 includes, wherein the means for forming the virtual block comprises means for creating a table entry in a L2P table indicating that the first and second portions form a virtual block.

In Example 55, the subject matter of Examples 53-54 includes, means for grouping a second virtual block with the virtual block and storing a third portion of data in the second virtual block.

In Example 56, the subject matter of Example 55 includes, means for selecting the second virtual block based upon the second virtual block being on a different plane than the virtual block, and wherein the means for storing the third portion of data occurs concurrently with the storing the first portion of data.

In Example 57, the subject matter of Example 56 includes, means for grouping the first and second virtual blocks with a third virtual block, the third virtual block being on a different die than the first and second virtual blocks.

In Example 58, the subject matter of Examples 53-57 includes, wherein the data is host data received from a host.

In Example 59, the subject matter of Examples 53-58 includes, wherein the data is system data.

In Example 60, the subject matter of Examples 58-59 includes, wherein the system data is a portion of a logical to physical translation table.

Example 61 is at least one machine-readable medium including instructions that, when executed by processing circuitry, cause the processing circuitry to perform operations to implement of any of Examples 1-60.

Example 62 is an apparatus comprising means to implement of any of Examples 1-60.

Example 63 is a system to implement of any of Examples 1-60.

Example 64 is a method to implement of any of Examples 1-60.

The invention claimed is:

1. A memory device comprising:
   a processor;
   a memory, storing instructions, which when executed, causes the processor to perform operations comprising:
   identifying that a first deck of a block of three-dimensional NAND has a defect of a type from an identified list of defect types;
   identifying that a second deck of the block does not have a defect from the identified list of defect types;
   testing the second deck to determine if it meets at least one quality criterion;
   responsive to determining that the second deck meets at least one quality criterion, marking the second deck as salvageable;
   receiving a memory device request;
   identifying a bias voltage for the first deck of the block; and
   servicing the memory device request serviced using NAND cells in the second deck, the servicing the memory device request comprising disabling the first deck during the servicing by applying the bias voltage to word lines of the first deck.

2. The memory device of claim 1, wherein one or more address bits in the memory device request indicate that the memory device request is indicating the second deck.

3. The memory device of claim 1, wherein the operations of servicing the memory device request using NAND cells in the second deck is responsive to enablement of an option.

4. The memory device of claim 3, wherein the operations further comprise:
   determining that a number of defective blocks during operation of the memory device has exceeded a specified threshold and in response, enabling the option.

5. The memory device of claim 1, wherein the identified list of defect types comprises a word line-to-word line short that only impacts data word lines; a resistive word line; a slow to program word line; and a word line that does not pass a raw bit error rate requirement.

6. The memory device of claim 1, wherein the first deck is a bottom deck and the second deck is a top deck in the three-dimensional NAND.

7. The memory device of claim 1, wherein the memory device request is a write command to write host data.

8. A method of operating a memory device, the method comprising:
   identifying that a first deck of a block of three-dimensional NAND of the memory device has a defect of a type from an identified list of defect types;
   identifying that a second deck of the block does not have a defect from the identified list of defect types;
   testing the second deck to determine if it meets at least one quality criterion;
   responsive to determining that the second deck meets at least one quality criterion, marking the second deck as salvageable;
   receiving a memory device request;
   identifying a bias voltage for the first deck of the block; and
   servicing the memory device request serviced using NAND cells in the second deck, the servicing the memory device request comprising disabling the first deck during the servicing by applying the bias voltage to word lines of the first deck.

9. The method of claim 8, wherein one or more address bits in the memory device request indicate that the memory device request is indicating the second deck.

10. The method of claim 8, wherein servicing the memory device request using NAND cells in the second deck is responsive to enablement of an option.

11. The method of claim 10, wherein the method further comprises:
   determining that a number of defective blocks during operation of the memory device has exceeded a specified threshold and in response, enabling the option.

12. The method of claim 8, wherein the identified list of defect types comprises a word line-to-word line short that only impacts data word lines; a resistive word line; a slow to program word line; and a word line that does not pass a raw bit error rate requirement.

13. The method of claim 8, wherein the first deck is a bottom deck and the second deck is a top deck in the three-dimensional NAND.

14. The method of claim 8, wherein the memory device request is a write command to write host data.

15. A non-transitory, machine-readable medium, storing instructions, which when executed, causes a hardware processor of a memory device to perform operations comprising:
   identifying that a first deck of a block of three-dimensional NAND has a defect of a type from an identified list of defect types;
   identifying that a second deck of the block does not have a defect from the identified list of defect types;
   testing the second deck to determine if it meets at least one quality criterion;
   responsive to determining that the second deck meets at least one quality criterion, marking the second deck as salvageable;
   receiving a memory device request;
   identifying a bias voltage for the first deck of the block; and
   servicing the memory device request serviced using NAND cells in the second deck, the servicing the memory device request comprising disabling the first deck during the servicing by applying the bias voltage to word lines of the first deck.

16. The non-transitory machine-readable medium of claim 15, wherein one or more address bits in the memory device request indicate that the memory device request is indicating the second deck.

17. The non-transitory machine-readable medium of claim 15, wherein the operations of servicing the memory device request using NAND cells in the second deck is responsive to enablement of an option.

18. The non-transitory machine-readable medium of claim 17, wherein the operations further comprise:
   determining that a number of defective blocks during operation of the memory device has exceeded a specified threshold and in response, enabling the option.

19. The non-transitory machine-readable medium of claim 15, wherein the identified list of defect types comprises a word line-to-word line short that only impacts data word lines; a resistive word line; a slow to program word line; and a word line that does not pass a raw bit error rate requirement.

20. The non-transitory machine-readable medium of claim 15, wherein the first deck is a bottom deck and the second deck is a top deck in the three-dimensional NAND.

\* \* \* \* \*